(12) United States Patent
Shimokawa et al.

(10) Patent No.: US 10,379,317 B2
(45) Date of Patent: Aug. 13, 2019

(54) IMAGE SENSOR AND ELECTRONIC DEVICE HAVING THE SAME

(71) Applicant: Samsung Electronics Co., Ltd, Gyeonggi-do (KR)

(72) Inventors: Shuichi Shimokawa, Gyeonggi-do (KR); Sangmin Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 4 days.

(21) Appl. No.: 15/353,692

(22) Filed: Nov. 16, 2016

(65) Prior Publication Data

US 2017/0142325 A1    May 18, 2017

(30) Foreign Application Priority Data

Nov. 16, 2015    (KR) .................. 10-2015-0160330

(51) Int. Cl.
| | |
|---|---|
| *G02B 7/28* | (2006.01) |
| *H04N 5/232* | (2006.01) |
| *H04N 5/3745* | (2011.01) |
| *H01L 27/146* | (2006.01) |
| *H04N 5/347* | (2011.01) |

(52) U.S. Cl.
CPC .......... *G02B 7/28* (2013.01); *H01L 27/14641* (2013.01); *H04N 5/232122* (2018.08); *H04N 5/347* (2013.01); *H04N 5/37457* (2013.01); *H01L 27/14603* (2013.01); *H01L 27/14612* (2013.01)

(58) Field of Classification Search
CPC ........................................................ G02B 7/28
USPC ........................................ 348/294, 345, 349
See application file for complete search history.

(56) References Cited

U.S. PATENT DOCUMENTS

| | | |
|---|---|---|
| 6,452,153 B1 | 9/2002 | Lauxtermann et al. |
| 6,657,665 B1 | 12/2003 | Guidash |
| 8,130,304 B2 | 3/2012 | Yin et al. |

(Continued)

FOREIGN PATENT DOCUMENTS

| | | |
|---|---|---|
| EP | 1102323 A1 | 5/2001 |
| EP | 2154879 A1 | 2/2010 |

(Continued)

OTHER PUBLICATIONS

Foreign Communication from a Related Counterpart Application, PCT Application No. PCT/KR2016/013126, International Search Report dated Feb. 20, 2017, 3 pages.

(Continued)

*Primary Examiner* — Sinh Tran
*Assistant Examiner* — Zhenzhen Wu

(57) ABSTRACT

An image sensor according to an embodiment may include a plurality of pixels. Each pixel of the plurality of pixels may include first, second, third and fourth photodiodes configured to convert light into an electric signal, and an electric circuit configured to add at least two of the electrical signals converted respectively by the first, second, third and fourth photodiodes and then output the added signals. An electronic device according to an embodiment may include the image sensor. The image sensor and the electronic device may offer an auto focusing function by controlling signals converted by and outputted from the plurality of photodiodes. Other various embodiments are possible.

10 Claims, 13 Drawing Sheets

(56) References Cited

U.S. PATENT DOCUMENTS

| | | | |
|---|---|---|---|
| 8,659,688 B2* | 2/2014 | Wakano | H01L 27/14609 348/294 |
| 8,698,930 B2 | 4/2014 | Kinugasa et al. | |
| 8,704,926 B2 | 4/2014 | Schemmann et al. | |
| 2009/0140304 A1* | 6/2009 | Kudoh | H01L 27/14603 257/292 |
| 2010/0225795 A1* | 9/2010 | Suzuki | H01L 27/14609 348/300 |
| 2010/0252718 A1* | 10/2010 | Lee | H01L 27/14603 250/208.1 |
| 2011/0025894 A1* | 2/2011 | Seko | H01L 27/14623 348/294 |
| 2012/0194721 A1 | 8/2012 | Sakaida | |
| 2013/0057744 A1* | 3/2013 | Minagawa | H04N 5/35563 348/311 |
| 2013/0070133 A1* | 3/2013 | Takazawa | H04N 5/335 348/294 |
| 2013/0250154 A1* | 9/2013 | Hirose | H04N 5/23212 348/311 |
| 2013/0334399 A1 | 12/2013 | Dupont | |
| 2014/0048853 A1 | 2/2014 | Choi et al. | |
| 2014/0104397 A1 | 4/2014 | Shin et al. | |
| 2014/0146197 A1 | 5/2014 | Okuzawa et al. | |
| 2014/0218580 A1 | 8/2014 | Mayer et al. | |
| 2014/0327061 A1 | 11/2014 | Lee | |
| 2014/0347532 A1* | 11/2014 | Kang | H04N 5/351 348/294 |
| 2015/0294999 A1* | 10/2015 | Zhang | H01L 27/14621 257/292 |
| 2016/0234452 A1 | 8/2016 | Aoki | |
| 2017/0077166 A1* | 3/2017 | Kitamori | H01L 27/14643 |

FOREIGN PATENT DOCUMENTS

| | | |
|---|---|---|
| KR | 20100064501 A | 6/2010 |
| KR | 20110065771 A | 6/2011 |
| KR | 20110079069 A | 7/2011 |
| WO | 2015068507 A1 | 5/2015 |

OTHER PUBLICATIONS

Communication from a foreign patent office in a counterpart foreign application, European Patent Office, "Supplementary European Search Report," Application No. EP 16866625.3, dated Aug. 10, 2018, 7 pages.

* cited by examiner

IMAGE SENSOR AND ELECTRONIC DEVICE HAVING THE SAME

CROSS-REFERENCE TO RELATED APPLICATION(S) AND CLAIM OF PRIORITY

The present application is related to and claims the benefit under 35 U.S.C. § 119(a) of Korean patent application filed on Nov. 16, 2015 in the Korean Intellectual Property Office and assigned Serial number 10-2015-0160330, the entire disclosure of which is hereby incorporated by reference.

TECHNICAL FIELD

Various embodiments of the present disclosure relate to an image sensor having a plurality of photodiodes and to an electronic device having the image sensor.

BACKGROUND

With remarkable growths of information communication technology and semiconductor technology, a great variety of electronic devices are increasingly popularized in these days. Additionally, such electronic devices today outgrow their respective traditional fields and hence reach a mobile convergence stage in which the fields of other type devices are incorporated. For example, a smart phone, which has been dramatically popularized in recent years, has ability to offer numerous functions, such as a broadcasting receiver, a multimedia player, an internet access, an electronic organizer, or a social network service (SNS), as well as typical communication functions such as a voice call or a short message service (SMS).

Particularly, recent electronic devices provide a camera function to create and store an image or a video. Further, in order to meet increasing consumers' demands for a high-quality still image and/or video, a higher-resolution camera module is equipped in recent electronic devices.

Recent camera modules provide an autofocus (AF) function to automatically set focus so as to offer a high-quality image or video. For this AF function, an image sensor embedded in the camera module may use various AF techniques such as a contrast-detection AF based on the extraction of contour information from an image, a phase-detection AF based on the use of a phase-difference sensor, a focal-plane phase-detection AF for focusing over a wide area, and the like.

SUMMARY

To address the above-discussed deficiencies, it is a primary object to provide an image sensor having a plurality of photodiodes in a unit pixel and being capable of detecting a phase difference in a vertical or horizontal direction from a signal obtained at the unit pixel, and also provide an electronic device having such an image sensor.

An image sensor according to various embodiments of the present disclosure may include a plurality of pixels. Each of the plurality of pixels may comprise first, second, third and fourth photodiodes configured to convert light into electric signals, and an electric circuit configured to add at least two of the electrical signals converted respectively by the first, second, third and fourth photodiodes and output the added signals.

An electronic device according to various embodiments of the present disclosure may comprise an image sensor including a plurality of pixels, and a processor configured to control operations of the image sensor and perform an auto focusing function. Each of the plurality of pixels may comprise first, second, third and fourth photodiodes configured to convert light into an electric signal, and an electric circuit configured to add at least two of the electrical signals converted respectively by the first, second, third and fourth photodiode and output the added signals.

According to various embodiments of the present disclosure, the image sensor and the electronic device having the image sensor may offer a precise auto focusing function and a high-quality image or video by calculating a phase difference through a comparison of signals received from a plurality of photodiodes.

Additionally, the image sensor and the electronic device may detect a phase difference in a vertical or horizontal direction from a signal obtained at one unit pixel by controlling a connection of the photodiodes by means of a transfer gate connected between the photodiodes.

Also, the image sensor and the electronic device may provide an exact and fast auto focusing function regardless of the characteristics of an image or video by detecting a phase difference in a vertical or horizontal direction from a signal obtained at one unit pixel.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
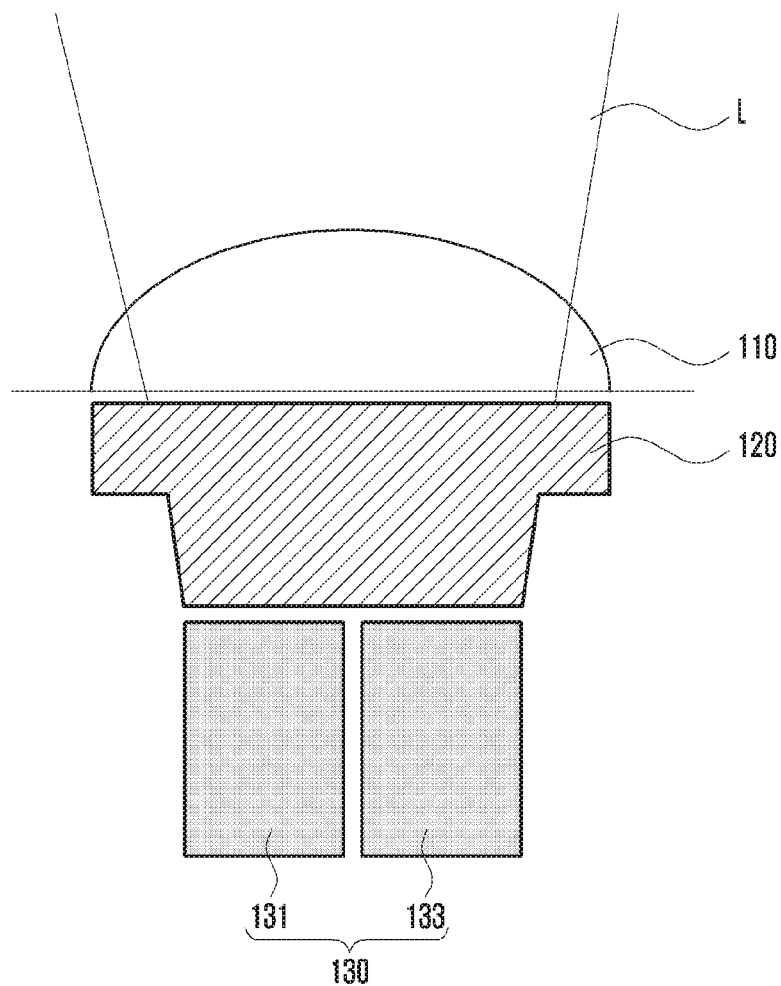
FIG. 1 illustrates a schematic structure of an image sensor according to various embodiments of the present disclosure.

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, exemplary embodiments of the present disclosure are described in detail with reference to the accompanying drawings. While the present disclosure may be embodied in many different forms, specific embodiments of the present disclosure are shown in drawings and are described herein in detail, with the understanding that the present disclosure is to be considered as an exemplification of the principles of the disclosure and is not intended to limit the disclosure to the specific embodiments illustrated. The same reference numbers are used throughout the drawings to refer to the same or like parts.

An expression "comprising" or "may comprise" used in the present disclosure indicates presence of a corresponding function, operation, or element and does not limit additional at least one function, operation, or element. Further, in the present disclosure, a term "comprise" or "have" indicates presence of a characteristic, numeral, step, operation, element, component, or combination thereof described in a specification and does not exclude presence or addition of at least one other characteristic, numeral, step, operation, element, component, or combination thereof.

In the present disclosure, an expression "or" includes any combination or the entire combination of words listed together. For example, "A or B" may include A, B, or A and B.

An expression of a first and a second in the present disclosure may represent various elements of the present disclosure, but does not limit corresponding elements. For example, the expression does not limit order and/or importance of corresponding elements. The expression may be used for distinguishing one element from another element. For example, both a first user device and a second user device are user devices and represent different user devices. For example, a first constituent element may be referred to as a second constituent element without deviating from the scope of the present disclosure, and similarly, a second constituent element may be referred to as a first constituent element.

When it is described that an element is "coupled" to another element, the element may be "directly coupled" to the other element or "electrically coupled" to the other element through a third element. However, when it is described that an element is "directly coupled" to another element, no element may exist between the element and the other element.

Terms used in the present disclosure are not to limit the present disclosure but to illustrate exemplary embodiments. When used in a description of the present disclosure and the appended claims, a singular form includes a plurality of forms unless it is explicitly differently represented.

Unless differently defined, entire terms including a technical term and a scientific term used here have the same meaning as a meaning that may be generally understood by a person of common skill in the art. It should be analyzed that generally using terms defined in a dictionary have a meaning corresponding to that of a context of related technology and are not analyzed as an ideal or excessively formal meaning unless explicitly defined.

In this disclosure, an electronic device may be a device that involves a communication function. For example, an electronic device may be a smart phone, a tablet PC (Personal Computer), a mobile phone, a video phone, an e-book reader, a desktop PC, a laptop PC, a netbook computer, a PDA (Personal Digital Assistant), a PMP (Portable Multimedia Player), an MP3 player, a portable medical device, a digital camera, or a wearable device (e.g., an HMD (Head-Mounted Device) such as electronic glasses, electronic clothes, an electronic bracelet, an electronic necklace, an electronic appcessory, or a smart watch).

According to some embodiments, an electronic device may be a smart home appliance that involves a communication function. For example, an electronic device may be a TV, a DVD (Digital Video Disk) player, audio equipment, a refrigerator, an air conditioner, a vacuum cleaner, an oven, a microwave, a washing machine, an air cleaner, a set-top box, a TV box (e.g., Samsung HomeSync™, Apple TV™, Google TV™, etc.), a game console, an electronic dictionary, an electronic key, a camcorder, or an electronic picture frame.

According to some embodiments, an electronic device may be a medical device (e.g., MRA (Magnetic Resonance Angiography), MRI (Magnetic Resonance Imaging), CT (Computed Tomography), ultrasonography, etc.), a navigation device, a GPS (Global Positioning System) receiver, an EDR (Event Data Recorder), an FDR (Flight Data Recorder), a car infotainment device, electronic equipment for a ship (e.g., a marine navigation system, a gyrocompass, etc.), avionics, security equipment, or an industrial or home robot.

According to some embodiments, an electronic device may be furniture or part of a building or construction having a communication function, an electronic board, an electronic signature receiving device, a projector, or various measuring instruments (e.g., a water meter, an electric meter, a gas meter, a wave meter, etc.). An electronic device disclosed herein may be one of the above-mentioned devices or any combination thereof. As well understood by those skilled in the art, the above-mentioned electronic devices are exemplary only and not to be considered as a limitation of this disclosure.

FIG. 1 is a diagram illustrating a schematic structure of an image sensor according to various embodiments of the present disclosure.

The image sensor according to an embodiment of this disclosure may include a micro lens 110, a color filter 120, and a plurality of photodiodes 130.

The micro lens 110 may collect light (L) from the outside and deliver the light to the color filter 120. For example, the micro lens 110 may receive incident light (L) at various angles and deliver the received light to the color filter 120 and the photodiodes 130. According to an embodiment, the micro lens 110 may be formed in a larger area than those of the color filter 120 and the photodiodes 130 disposed under the micro lens 110.

The color filter 120 may separate light having a specific wavelength from the received light (L) and deliver the separated light to the photodiode 130. For example, the color filter 120 may separate light corresponding to at least one wavelength and then send it to the photodiodes 130. For example, the color filter 120 may be formed of red (R), green (G) and blue (B) filters which are disposed in a regular pattern. For example, the R filter may separate light of a wavelength corresponding to red light from the received light (L) and then send it to the photodiodes 130. Similarly, the G filter may separate light of a wavelength corresponding to green light from the received light (L) and then send it to the photodiodes 130, and the B filter may separate light of a wavelength corresponding to blue light from the received light (L) and then send it to the photodiodes 130. Alternatively, the color filter 120 may be formed of other combination of various color filters. For example, a combination of red, green, white and blue (RGWB) or of cyan, yellow and magenta (CYM) may be used. Also, several color filters may be used, separating wavelengths into smaller bands rather than separating the wavelengths into the three primary colors or complementary colors. And also, instead of using a filter, it is possible to separate light according to wavelengths by using light absorption characteristics of a silicon material.

According to an embodiment, the image sensor may include a plurality of photodiodes 131 and 133. The photodiodes 131 and 133 may be disposed under the color filter 120 in a regular arrangement, e.g., in a grid form. For example, four photodiodes may be disposed under the color filter 120 in a 2×2 arrangement. According to various embodiments, the plurality of photodiodes 131 and 133 may be disposed in various arrangements and patterns. This photodiodes 130 may convert light (L) into an electric signal and then output the signal.

According to an embodiment, the image sensor may include a light guide (not shown) for guiding light (L) entering into the image sensor to a predefined path while preventing the leakage of light, a floating diffusion region (not shown) for storing an electric signal (e.g., an electric energy) converted by the photodiodes 130, a source follower (not shown) for outputting the electric signal processed in the image sensor, a convertor (not shown, e.g., an analog-to-digital convertor (ADC)) for converting the electric signal converted by the photodiodes 130 into a digital signal, and a transistor (not shown, e.g., a transfer gate) for controlling signals in the image sensor. According to various embodiments, although not shown in FIG. 1, the image sensor may include a circuit structure and a wiring structure (i.e., wiring layers) for driving and controlling the photodiode 130. According to an embodiment, the image sensor may include or be electrically connected with a processor (e.g., a digital signal processor (DSP), an image signal processor (ISP), etc.) for processing the signal output from the photodiode 130. According to various embodiments, the image sensor may further include well-known elements of a CMOS image sensor.

Figure 2A:
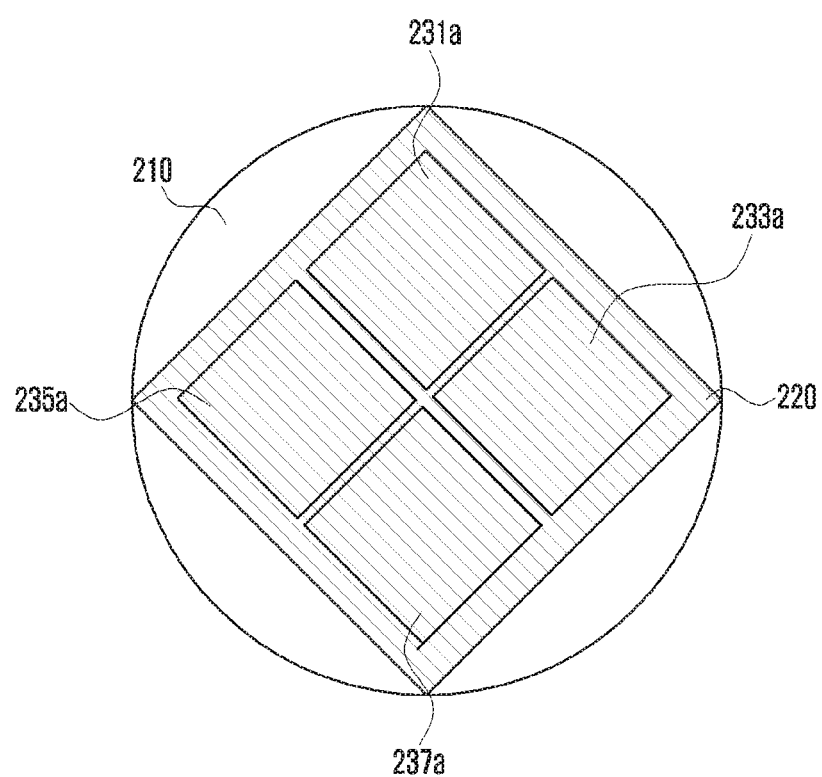
FIGS. 2A and 2B illustrate plan views of a schematic structure of an image sensor according to various embodiments of the present disclosure.
Figure 2B:
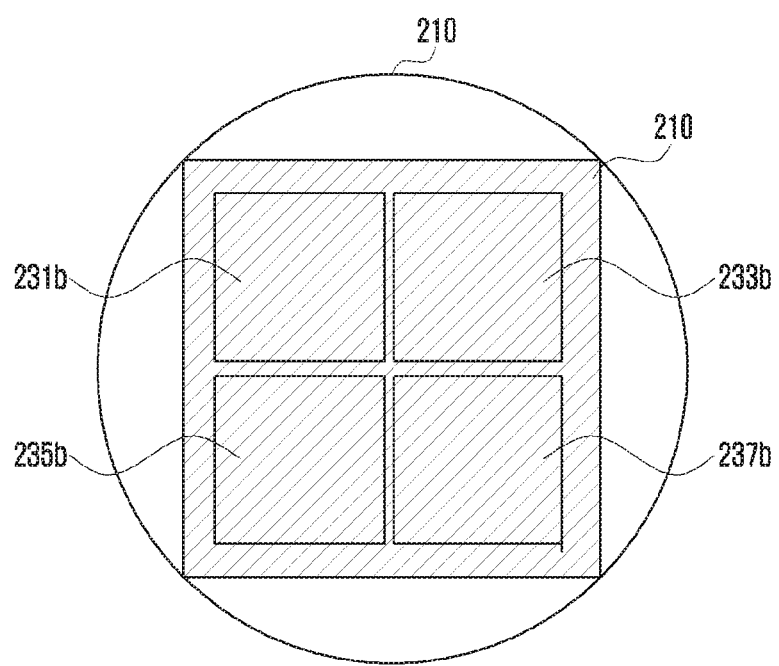

FIGS. 2A and 2B are plan views illustrating a schematic structure of an image sensor according to various embodiments of the present disclosure. For example, FIGS. 2A and 2B depict a structure seen from the top of the image sensor shown in FIG. 1.

Referring to FIG. 2A, according to an embodiment, a color filter 220 having a quadrangular shape may be disposed under a micro lens 210 having a circular shape, and a plurality of photodiodes 231a, 233a, 235a and 237a having a quadrangular shape may be disposed under the color filter 220. According to an embodiment, the photodiodes 231a, 233a, 235a and 237a may be disposed in a regular arrangement. According to various embodiments, the shape of the color filter 220 and the shape of photodiodes 231a, 233a, 235a and 237a may be changed depending on the configuration and design of the image sensor. For example, the color filter 220 or the photodiodes 231a, 233a, 235a and 237a may have various shapes such as a circular shape, a hexagonal shape, an octagonal shape, etc. as well as a quadrangular shape.

According to an embodiment, the photodiodes 231a, 233a, 235a and 237a may be disposed respectively at upper, right, left and lower positions in a diamond shape. According to an embodiment, the image sensor may compare signals output from the upper and lower photodiodes 231a and 237a. For example, the image sensor may provide an auto focusing function by comparing and processing a phase difference between the signals output from the upper and lower photodiodes 231a and 237a. Similarly, the image sensor may provide an auto focusing function by comparing and processing a phase difference between signals output from the left and right photodiodes 235a and 233a.

Referring to FIG. 2B, the photodiodes 231b, 233b, 235b and 237b may be disposed in a 2×2 arrangement, namely, at two upper positions and two lower positions. For example, the photodiodes 231b, 233b, 235b and 237b may be disposed in a grid form. According to an embodiment, the image sensor may compare and process signals output from each of the photodiodes 231b, 233b, 235b and 237b. For example, the image sensor may provide an auto focusing function by comparing and processing a phase difference between the signals output from each of the photodiodes 231b, 233b, 235b and 237b. For example, the image sensor may compare signals added for respective lines and then offer data for detecting a phase difference in a horizontal direction (i.e., in the left and right direction) or in a vertical direction (i.e., in the up and down direction). For example, the image sensor may add electric signals output from the upper left and upper right photodiodes 231b and 233b, from the upper left and lower left photodiodes 231b and 235b, from the upper right and lower right photodiodes 233b and 237b, or from the lower left and lower right photodiodes 235b and 237b. According to an embodiment, a processor (e.g., a processor of an electronic device, an image signal processor (ISP) electrically connected with the image sensor, etc.) may compare and process the added signals output from the image sensor and thereby provide an auto focusing function based on a phase difference in a horizontal or vertical direction.

According to various embodiments, the image sensor may include four or more photodiodes, which are not limited to the arrangements shown in FIGS. 2A and 2B and may be disposed in any other arrangement. According to various embodiments, the image sensor may also include various wiring structures (i.e., various structures of wiring layers) depending on the disposition of the photodiodes.

Figure 3:
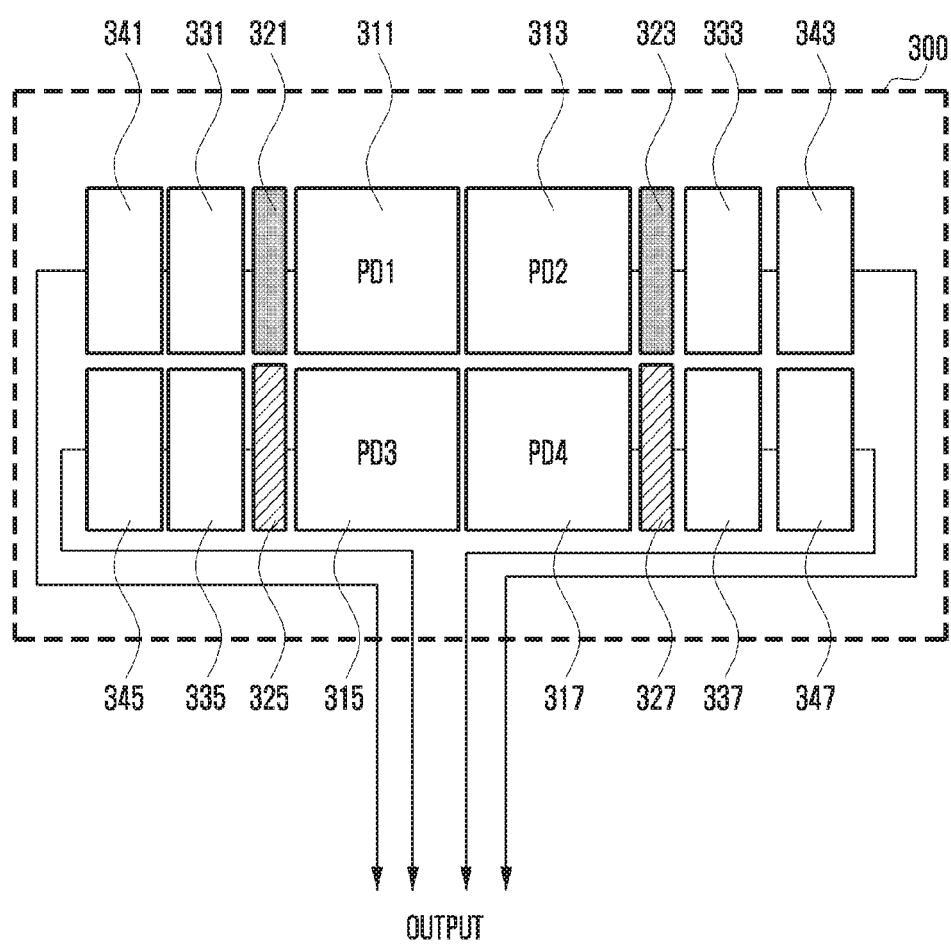
FIG. 3 illustrates a structure of a unit pixel of an image sensor according to various embodiments of the present disclosure.

FIG. 3 is a diagram illustrating a structure of a unit pixel of an image sensor according to various embodiments of the present disclosure. FIG. 3 shows a case of outputting signals from each of a plurality of photodiodes.

According to an embodiment, the image sensor may include a plurality of pixels. For example, the image sensor may include a pixel array composed of a plurality of pixels.

According to an embodiment, each pixel (e.g., a unit pixel 300) of the image sensor may include first, second, third and fourth photodiodes 311, 313, 315 and 317 for converting light into electric signals, and an electric circuit for outputting the electric signals to the outside of unit pixel 300.

According to an embodiment, the first to fourth photodiodes 311, 313, 315 and 317 may be disposed in a certain arrangement. For example, the first to fourth photodiodes 311, 313, 315 and 317 may be disposed around the center of the unit pixel 300. For example, the first photodiode 311, the second photodiode 313, the third photodiode 315, and the fourth photodiode 317 may be disposed at an upper left position, at an upper right position, at a lower left position, and at a lower right position, respectively, thus being arranged in a grid.

According to an embodiment, each of the four photodiodes 311, 313, 315 and 317 may operate individually. For example, each or at least some of the four photodiodes 311, 313, 315 and 317 may be disposed to be electrically disconnected from each other. For example, the first and second photodiodes 311 and 313 may be disposed to be electrically disconnected from each other. Similarly, the third and fourth photodiodes 315 and 317 may be disposed to be electrically disconnected from each other.

According to an embodiment, the electric circuit may include a plurality of floating diffusion regions 331, 333, 335 and 337 for outputting the electric signals converted by the first to fourth photodiodes 311, 313, 315 and 317 to the outside of the unit pixel 300, and a plurality of transfer gates 321, 323, 325 and 327 for turning on or off electrical connections between each of the photodiodes 311, 313, 315 and 317 and each of the floating diffusion regions 331, 333, 335 and 337.

According to an embodiment, the floating diffusion regions 331, 333, 335 and 337 may include a first floating diffusion region 331 for storing or outputting the electric signal converted by the first photodiode 311, a second floating diffusion region 333 for storing or outputting the electric signal converted by the second photodiode 313, a third floating diffusion region 335 for storing or outputting the electric signal converted by the third photodiode 315, and a fourth floating diffusion region 337 for storing or outputting the electric signal converted by the fourth photodiode 317.

According to an embodiment, one end of each of the photodiodes 311, 313, 315 and 317 may be connected with one of the transfer gates. For example, the first transfer gate 321 may be connected between the first photodiode 311 and the first floating diffusion region 331, and the second transfer gate 323 may be connected between the second photodiode 313 and the second floating diffusion region 333. Also, the third transfer gate 325 may be connected between the third photodiode 315 and the third floating diffusion region 335, and the fourth transfer gate 327 may be connected between the fourth photodiode 317 and the fourth floating diffusion region 337. Each of the first to fourth transfer gates 321, 323, 325 and 327 may control the transmission of the electric signal converted by the corresponding photodiode 311, 313, 315 or 317 to the corresponding floating diffusion region 331, 333, 335 or 337. For example, the first transfer gate 321 may deliver or not the electric signal converted by the first photodiode 311 to the first floating diffusion region 331 by turning on or off an electrical connection between the first photodiode 311 and the first floating diffusion region 331.

According to an embodiment, one end of each of the floating diffusion regions 331, 333, 335 and 337 may be connected with one of the source followers for outputting the electric signal to the outside of the unit pixel 300. For example, the first floating diffusion region 331 may be connected, at one end thereof, with the first source follower 341, and the second floating diffusion region 333 may be connected, at one end thereof, with the second source follower 343. Also, the third floating diffusion region 335 may be connected, at one end thereof, with the third source follower 345, and the fourth floating diffusion region 337 may be connected, at one end thereof, with the fourth source follower 347. According to an embodiment, each of the source followers 341, 343, 345 and 347 may output an electric signal corresponding to an electric energy (e.g., an electric energy converted from light by each photodiode 311, 313, 315 or 317) stored in the corresponding floating diffusion region to the outside of the unit pixel 300.

According to an embodiment, a processor (e.g., a processor of an electronic device, an image signal processor (ISP) electrically connected with the image sensor, etc.) may provide an auto focusing function by using signals output from the respective photodiodes 311, 313, 315 and 317. For example, in an electronic device shown in FIG. 12, a processor 1210 or an image signal processor (ISP) included in a camera module 1291 may provide an auto focusing function by using signals output from the respective photodiodes 311, 313, 315 and 317.

For example, the processor may compare and process the signals output from the unit pixel 300. For example, the processor may detect a phase difference between an image by using the signals output from the unit pixel 300. For example, the image sensor may add the signals output from the unit pixel 300. For example, the processor may perform an auto focusing function by adding and processing the signals output from the unit pixel 300. For example, the processor may adjust the focus of an image in the horizontal direction (i.e., in the left and right direction) by using the signals output from the left photodiodes 311 and 315 and the right photodiodes 313 and 317. Similarly, the processor may adjust the focus of an image in the vertical direction (i.e., in the up and down direction) by using the signals output from the upper photodiodes 311 and 313 and the lower photodiodes 315 and 317.

According to various embodiments, the image sensor may process, in one time period, two time periods, or four time periods, the signals received from the first to fourth photodiodes 311, 313, 315 and 317 in the unit pixel 300. For example, the image sensor may control all the signals converted by the first to fourth photodiode 311, 313, 315 and 317 to be output in one time period. Alternatively, the image sensor may control the first to fourth photodiodes 311, 313, 315 and 317 to output signals depending on lines. For example, the image sensor may process first the signals output from the upper photodiodes 311 and 313 and then process the signals output from the lower photodiodes 315 and 317. Alternatively, the image sensor may process individually each signal output from the photodiodes 311, 313, 315 and 317 in four sequential time periods.

For example, in the case where image sensor processes all the signals output from the photodiodes 311, 313, 315 and 317 in one time period, the processor may obtain all the signals at a faster speed. This may, however, require a complicated circuit due to an increase in the number of pixels to be processed at one time. Additionally, an increase in signals to be transmitted at one time may overload a transmission line and also reduce a frame rate due to an increase in load on the processor (e.g., the number of times that the processor compares and adds the signal). On the contrary, in the case where the signals are output sequentially one by one from the photodiodes 311, 313, 315 and 317, a speed of obtaining the signals may decrease. Therefore, considering all of processing speed, transmission load, and the load on the processor, the most efficient image processing may be possible when the image sensor processes in two time periods the signals output from the four photodiodes 311, 313, 315 and 317, or in other words, when the image sensor processes in one time period the signals output from two photodiodes. According to various embodiments, the image sensor may selectively use all the above techniques by controlling the plurality of photodiodes 311, 313, 315 and 317 contained in the unit pixel 300 in view of various situations and desired conditions.

Figure 4:
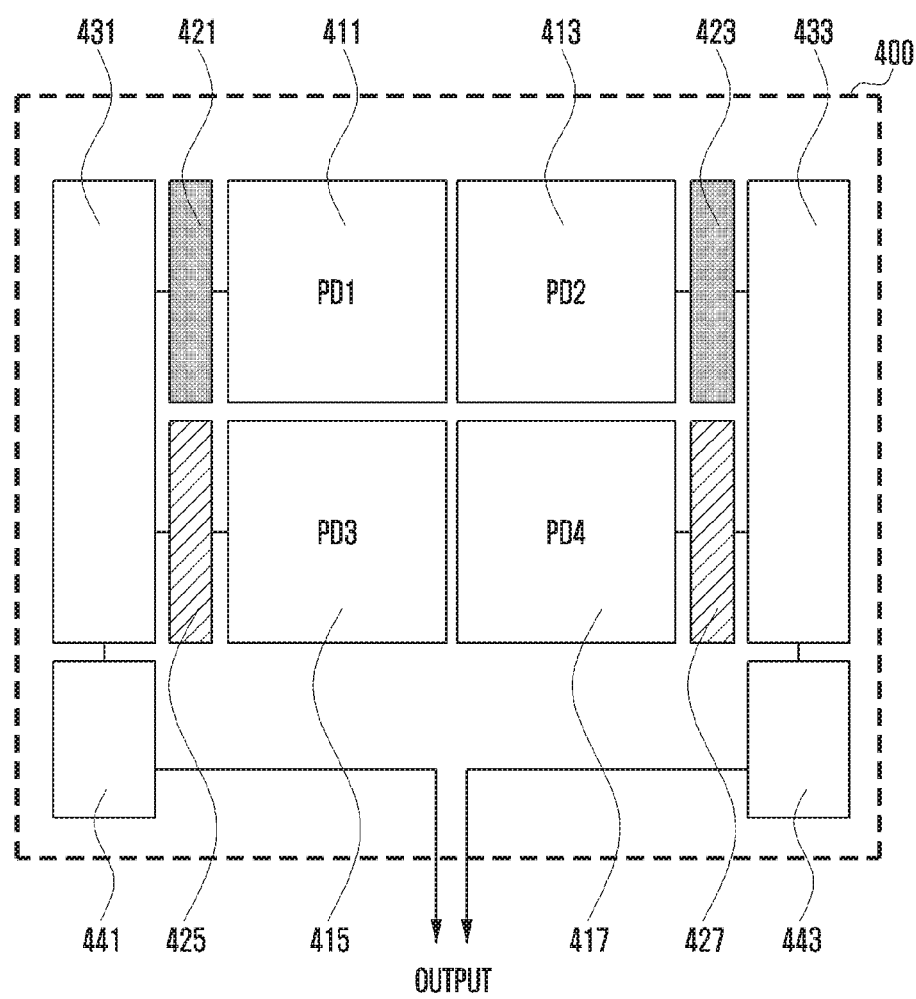
FIG. 4 illustrates a structure of a unit pixel of an image sensor according to various embodiments of the present disclosure.

FIG. 4 is a diagram illustrating a structure of a unit pixel of an image sensor according to various embodiments of the present disclosure. Hereinafter, features distinguished from those discussed previously in FIG. 3 will be described mainly.

According to an embodiment, each pixel (i.e., a unit pixel 400) of the image sensor may include first, second, third and fourth photodiodes 411, 413, 415 and 417, a plurality of transfer gates 421, 423, 425 and 427, a plurality of floating diffusion regions 431 and 433, and a plurality of source followers 441 and 443.

According to an embodiment, each or at least some of the photodiodes 411, 413, 415 and 417 may be disposed to be electrically disconnected from each other. For example, the first and second photodiodes 411 and 413 may be disposed to be electrically disconnected from each other. Also, the third and fourth photodiodes 415 and 417 may be disposed to be electrically disconnected from each other.

According to an embodiment, the unit pixel 400 may include the first floating diffusion region 431 for outputting an electric signal converted by the first or third photodiode 411 or 415 to the outside of the unit pixel 400, and the second floating diffusion region 433 for outputting an electric signal converted by the second or fourth photodiode 413 or 417 to the outside of the unit pixel 400.

According to an embodiment, one end of each of the photodiodes 411, 413, 415 and 417 may be connected with a transfer gate. For example, the first transfer gate 421 may be connected between the first photodiode 411 and the first floating diffusion region 431, and the second transfer gate 423 may be connected between the second photodiode 413 and the second floating diffusion region 433. Also, the third transfer gate 425 may be connected between the third photodiode 415 and the first floating diffusion region 431, and the fourth transfer gate 427 may be connected between the fourth photodiode 417 and the second floating diffusion region 433.

According to an embodiment, one end of the first floating diffusion region 431 may be connected with the first source follower 441, and one end of the second floating diffusion region 433 may be connected with the second source follower 443.

According to an embodiment, in the unit pixel 400 of the image sensor, at least two of the photodiodes 411, 413, 415 and 417 may share a floating diffusion region and a source follower.

For example, the electric signal converted by the first or third photodiode 411 or 415 may be stored (or accumulated) in the first floating diffusion region 431 or output to the outside of the unit pixel 400 through the first floating diffusion 431 and the first source follower 441. Similarly, the electric signal converted by the second or fourth photodiode 413 or 417 may be stored in the second floating diffusion region 433 or output to the outside of the unit pixel 400 through the second floating diffusion region 433 and the second source follower 443.

According to an embodiment, the image sensor may process, based on lines, the electric signals converted by the photodiodes 411, 413, 415 and 417 by controlling the transfer gates 421, 423, 425 and 427. For example, the first and second transfer gates 421 and 423 may be electrically connected to be controlled by the same control signal, and the third and fourth transfer gates 425 and 427 may be electrically connected to be controlled by the same control signal which is different from the control signal for the first and second transfer gates 421 and 423.

According to an embodiment, the image sensor may control the first transfer gate 421 to electrically connect the first photodiode 411 and the first floating diffusion region 431 and simultaneously control the second transfer gate 423 to electrically connect the second photodiode 413 and the second floating diffusion region 433. On the other hand, the image sensor may control the third and fourth transfer gates 425 and 427 to electrically separate the third and fourth photodiodes 415 and 517 from the first and second floating diffusion regions 431 and 433 such that electric signals converted by the upper photodiodes (i.e., the first and second photodiodes 411 and 413) may be output to the outside of the unit pixel 400. For example, the electric signal converted by the first photodiode 411 may be output through the first floating diffusion region 431 and the first source follower 441, and the electric signal converted by the second photodiode 413 may be output through the second floating diffusion region 433 and the second source follower 443.

In the same way, the image sensor may control the first and second transfer gates 421 and 423 to be in an electrically disconnected state and also control the third and fourth transfer gates 425 and 427 to be in an electrically connected state such that electric signals converted by the lower photodiodes (i.e., the third and fourth photodiodes 415 and 417) may be output to the outside of the unit pixel 400. For example, the electric signal converted by the third photodiode 415 may be output through the first floating diffusion region 431 and the first source follower 441, and the electric signal converted by the fourth photodiode 417 may be output through the second floating diffusion region 433 and the second source follower 443.

According to various embodiments, the image sensor may obtain and process, based on respective outputs, the electric signals converted by the photodiodes 411, 413, 415 and 417 in the unit pixel 400 by selectively controlling the transfer gates 421, 423, 425 and 427.

Figure 5:
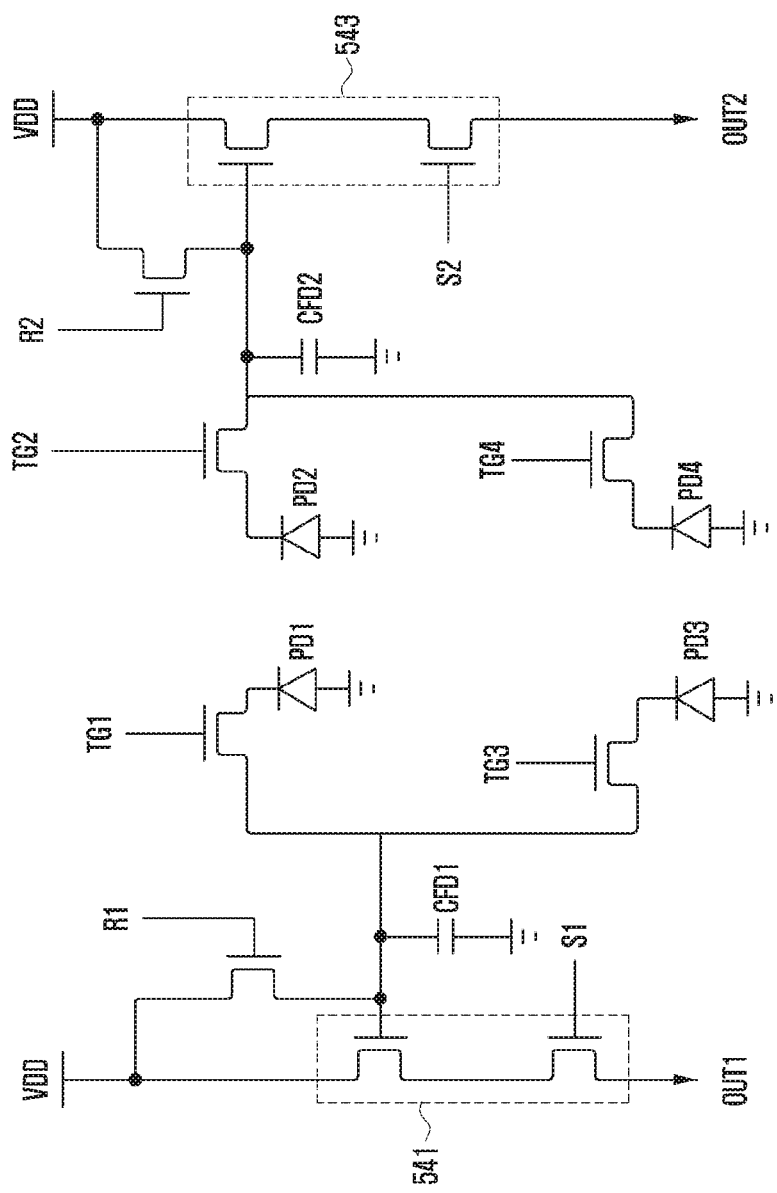
FIG. 5 illustrates a circuit diagram of a unit pixel of an image sensor according to various embodiments of the present disclosure.

FIG. 5 is a circuit diagram illustrating a unit pixel of an image sensor according to various embodiments of the present disclosure. FIG. 5 schematically shows a circuit of the unit pixel 400 shown in FIG. 4.

According to an embodiment, at least some of a plurality of photodiodes PD1, PD2, PD3 and PD4 may be disposed to be electrically disconnected. For example, a left circuit having the first and third photodiodes PD1 and PD3 may be electrically disconnected from a right circuit having the second and fourth photodiodes PD2 and PD4.

According to an embodiment, one end of each of the photodiodes PD1, PD2, PD3 and PD4 may be connected with a corresponding transfer gate. For example, one end of the first photodiode PD1 may be connected with the first transfer gate TG1, and one end of the third photodiode PD3 may be connected with the third transfer gate TG3. One end of the first transfer gate TG1 and one end of the third transfer gate TG3 may be connected with each other. For example, the first photodiode PD1 and the first transfer gate TG1 may be connected in parallel with the third photodiode PD3 and the third transfer gate TG3.

A node connected with the first and third transfer gates TG1 and TG3 may be connected with the first floating diffusion region CFD1. For example, the end connected with the first and third transfer gates TG1 and TG3 may be connected with the first floating diffusion capacitor CFD1 for storing electric energy (i.e., an electric signal) converted by the first or third photodiode PD1 or PD3.

The node connecting the first and third transfer gates TG1 and TG3 to the first floating diffusion region CFD1 may also be connected with the first source follower 541. One end of the first source follower 541 may be connected with a power source VDD. An input end (e.g., a gate of a transistor of the first source follower 541) for controlling the first source follower 541 may be connected with the node to which the first and third transfer gates TG1 and TG3 and the first floating diffusion region CFD1 are connected. The first source follower 541 may output electric energy (i.e., an electric signal) corresponding to that stored in the first floating diffusion region CFD1 to the outside of the unit pixel. In other words, the first source follower 541 may output the first output signal OUT1. According to an embodiment, the first source follower 541 may include a first selection element S1. For example, the first source follower 541 may output the first output signal OUT1 when a signal for a signal output is input to the first selection element S1.

According to an embodiment, the source and drain of first reset element R1 may be connected between the input end for controlling the first source follower 541 and the power source VDD. For example, by controlling the gate of first reset element R1, the image sensor may reset the circuit before and after the electric energy is stored in the first floating diffusion region CFD1, thus reducing error and offering a more precise focusing function.

According to an embodiment, one end of the second photodiode PD2 may be connected with the second transfer gate TG2, and one end of the fourth photodiode PD4 may be connected with the fourth transfer gate TG4. One end of the second transfer gate TG2 and one end of the fourth transfer gate TG4 may be connected with each other. For example, the second photodiode PD2 and the second transfer gate TG2 may be connected in parallel with the fourth photodiode PD4 and the fourth transfer gate TG4.

A node connected with the second and fourth transfer gates TG2 and TG4 may be connected with the second floating diffusion region CFD2. For example, the end connected with the second and fourth transfer gates TG2 and TG4 may be connected with the second floating diffusion capacitor CFD2 for storing an electric energy (i.e., an electric signal) converted by the second or fourth photodiode PD2 or PD4.

The node connecting the second and fourth photodiode PD2 and PD4 to the second floating diffusion region CFD2 may also be connected with the second source follower 543.

One end of the second source follower 543 may be connected with a power source VDD. An input end (e.g., a gate of a transistor of the second source follower 543) for controlling the second source follower 543 may be connected with the end to which the second and fourth transfer gates TG2 and TG4 and the second floating diffusion region CFD2 are connected. The second source follower 543 may output an electric energy (i.e., an electric signal) corresponding to that stored in the second floating diffusion region CFD2 to the outside of the unit pixel. In other words, the second source follower 543 may output the second output signal OUT2. According to an embodiment, the second source follower 543 may include a second selection element S2. For example, the second source follower 543 may output the second output signal OUT2 when a signal for a signal output is input to the second selection element S2.

According to an embodiment, the source and drain of second reset element R2 may be connected between the input end for controlling the second source follower 543 and the power source VDD. For example, by controlling the gate of second reset element R2, the image sensor may reset the circuit before and after the electric energy is stored in the second floating diffusion region CFD2, thus reducing error and offering a clearer image.

Figure 6:
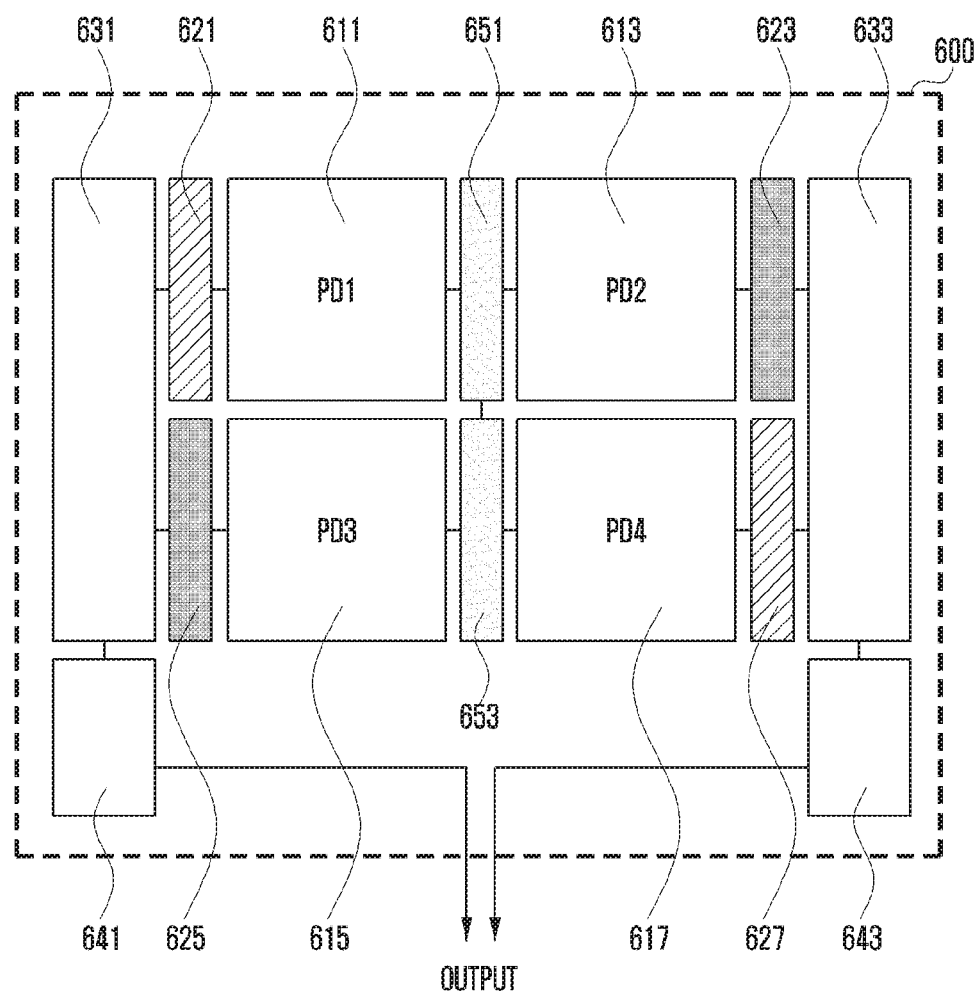
FIG. 6 illustrates a structure of a unit pixel of an image sensor according to various embodiments of the present disclosure.

FIG. 6 is a diagram illustrating a structure of a unit pixel of an image sensor according to various embodiments of the present disclosure. Hereinafter, features distinguished from those discussed previously in FIG. 4 will be described mainly.

According to an embodiment, a unit pixel 600 of the image sensor may include a plurality of photodiodes 611, 613, 615 and 617, a plurality of transfer gates 621, 623, 625, 627, 651 and 653, a plurality of floating diffusion regions 631 and 633, and a plurality of source followers 641 and 643.

According to an embodiment, the unit pixel 600 may include the first and second floating diffusion regions 631 and 633 for outputting electric signals converted by the first to fourth photodiodes 611, 613, 615 and 617 under the control of the transfer gates.

According to an embodiment, the transfer gates may be disposed on both ends of each of the photodiodes 611, 613, 615 and 617. For example, the first transfer gate 621 may be connected between the first photodiode 611 and the first floating diffusion region 631, and the second transfer gate 623 may be connected between the second photodiode 613 and the second floating diffusion region 633. Similarly, the third transfer gate 625 may be connected between the third photodiode 615 and the first floating diffusion region 631, and the fourth transfer gate 627 may be connected between the fourth photodiode 617 and the second floating diffusion region 633. Further, the fifth transfer gate 651 may be connected between the first and second photodiodes 611 and 613 so as to turn on or off an electrical connection therebetween. Similarly, the sixth transfer gate 653 may be connected between the third and fourth photodiodes 615 and 617 so as to turn on or off an electrical connection therebetween.

According to an embodiment, the fifth and sixth transfer gates 651 and 653 may be electrically connected to be controlled simultaneously by the first control signal. Also, the first and fourth transfer gates 621 and 627 may be electrically connected to be controlled simultaneously by the second control signal. And also, the second and third transfer gates 623 and 625 may be electrically connected to be controlled simultaneously by the third control signal.

According to an embodiment, by controlling the transfer gates 621, 623, 625, 627, 651 and 653, the image sensor may enable the unit pixel to add and then output at least two electric signals converted by the photodiodes 611, 613, 615 and 617.

Hereinafter, it is understood that the first to third control signals are signals for turning on or off the corresponding transfer gates.

For example, if the first and second control signals are turn-on signals, and if the third control signal is a turn-off signal, the fifth transfer gate 651 may electrically connect the first and second photodiodes 611 and 613 such that the electric signals converted by the first and second photodiodes 611 and 613 may be added. Also, the sixth transfer gate 653 may electrically connect the third and fourth photodiodes 615 and 617 such that the electric signals converted by the third and fourth photodiodes 615 and 617 may be added. In this case, since the first transfer gate 621 electrically connects the first floating diffusion region 631 and the first photodiode 611 in response to the second control signal, an added signal of electric signals converted by the first and second photodiodes 611 and 613 may be output to the outside of the unit pixel 600 through the first floating diffusion region 631 and the first source follower 641. Additionally, since the fourth transfer gate 627 electrically connects the second floating diffusion region 633 and the fourth photodiode 617 in response to the second control signal, an added signal of electric signals converted by the third and fourth photodiodes 615 and 617 may be output to the outside of the unit pixel 600 through the second floating diffusion region 633 and the second source follower 643.

In another example, if the first control signal is a turn-on signal, one of the second and third control signals is a turn-on signal, and the other of the second and third control signals is a turn-off signal, each of an added signal of electric signals converted by the upper photodiodes 611 and 613 and an added signal of electric signals converted by the lower photodiodes 615 and 617 may be output to the outside of the unit pixel 600 through one of the first and second floating diffusion regions 631 and 633.

In this case, the image sensor may obtain an upper added signal and a lower added signal. According to an embodiment, the processor may compare and process the electric signals converted by the upper photodiodes 611 and 613 and the electric signals converted by the lower photodiodes 615 and 617. For example, the processor may adjust the focus in the vertical direction (i.e., in the up and down direction) and perform an auto focusing function by detecting a phase difference between the upper and lower added electric signals and then processing the detected phase difference.

In another example, if the first control signal is a turn-off signal, and the second and third control signals are turn-on signals, the fifth transfer gate 651 may electrically disconnect the first and second photodiodes 611 and 613 and the sixth transfer gated 653 may electrically disconnect the third and fourth photodiodes 615 and 617. The first transfer gate 621 may electrically connect the first photodiode 611 and the floating diffusion region 631 and the third transfer gate 625 may electrically connect the third photodiode 615 and the first floating diffusion region 631. The second transfer gate 623 may electrically connect the second photodiode 613 and the second floating diffusion region 633 and the fourth transfer gate 627 may electrically connect the fourth photodiode 617 and the second floating diffusion region 633. In this case, the electric signal converted by the first photodiode 611 and the electric signal converted by the third photodiode 615 may be added at the first floating diffusion region 631, and the electric signal converted by the second photodiode 613 and the electric signal converted by the fourth photodiode 617 may be added at the second floating diffusion region 633. In this way, an added signal of the electric signals converted by the left photodiodes 611 and 615 and an added signal of the electric signals converted by the right photodiodes 613 and 617 may be output to the outside of the unit pixel 600 through the first and second floating diffusion regions 631 and 633, respectively.

In this case, the image sensor may obtain a left added signal and a right added signal. According to an embodiment, the processor may compare and process the electric signals converted by the left photodiodes 611 and 615 and the electric signals converted by the right photodiodes 613 and 617. For example, the processor may adjust the focus in the horizontal direction (i.e., in the left and right direction) and perform an auto focusing function by detecting a phase difference between the left and right added electric signals and then processing the detected phase difference.

According to various embodiments, by inserting a controllable transfer gate between at least some of the plurality of photodiodes 611, 613, 615 and 617 in the unit pixel 600, the image sensor may add the electric signals converted by the upper and lower photodiodes or by the left and right photodiodes and then output the added signals to the outside of the unit pixel 600. For example, the image sensor may output a signal capable of detecting a phase difference in the horizontal or vertical direction under the control of the transfer gates, and therefore the processor may offer a more exact and faster auto focusing function in the horizontal or vertical direction to a user. Also, the image sensor according to various embodiments may reduce a transmission load and a signal processing load of the processor by transmitting a signal after adding signals converted by at least two photodiodes. For example, the processor may immediately obtain a signal in a desired direction by controlling the transfer gates, and also immediately calculate a phase difference in the horizontal or vertical direction without any calculation for adding respective signals. The image sensor according to various embodiments may offer a more exact and faster auto focusing function to a user by reducing the calculation load of the processor and obtaining signals in horizontal and vertical directions.

Figure 7:
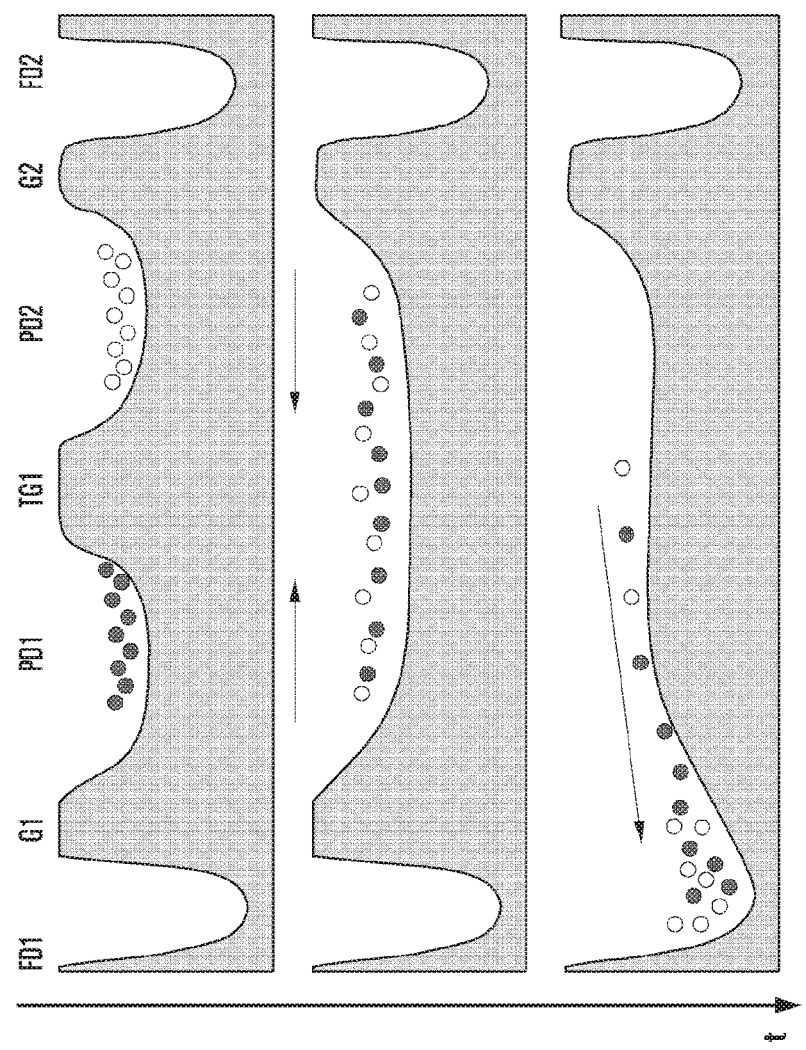
FIG. 7 illustrates an energy level in a unit pixel of an image sensor according to various embodiments of the present disclosure.

FIG. 7 is a diagram illustrating an energy level in a unit pixel of an image sensor according to various embodiments of the present disclosure.

FIG. 7 shows a case in which electric energies (i.e., electric signals) converted by the first and second photodiodes PD1 and PD2 are added in the unit pixel of the image sensor shown in FIG. 6. According to an embodiment, the first transfer gate TG1 may be disposed between the first and second photodiodes PD1 and PD2 so as to turn on or off an electrical connection therebetween.

According to an embodiment, the first floating diffusion region FD1 may be disposed at one end of the first photodiode PD1 so as to add and output signals converted by the first or second photodiode PD1 or PD2. Also, the second floating diffusion region FD2 may be disposed at one end of the second photodiode PD2 so as to add and output signals converted by the first or second photodiode PD1 or PD2.

According to an embodiment, the second transfer gate G1 may be disposed between the first photodiode PD1 and the first floating diffusion region FD1 so as to turn on or off an electrical connection therebetween. Also, the third transfer gate G2 may be disposed between the second photodiode PD2 and the second floating diffusion region FD2 so as to turn on or off an electrical connection therebetween.

According to an embodiment, the image sensor may control the first transfer gate TG1 (namely, lower the energy level of the first transfer gate TG1) to add an electric energy (e.g., an electric charge) converted from light by the first photodiode PD1 and an electric energy converted from light by the second photodiode PD2. Also, the image sensor may control the second transfer gate G1 (namely, lower the energy level of the second transfer gate G2) to move an added signal to the first floating diffusion region FD1. In other words, the image sensor may control the plurality of transfer gates TG1, G1 and G2 to add electric energies converted by the plurality of photodiodes PD1 and PD2 and then to store the added energies in one of the plurality of floating diffusion regions FD1 and FD2. Also, the image sensor may add the electric energies converted by the plurality of photodiodes PD1 and PD2 and then output the added energies to the outside of the unit pixel through the floating diffusion regions FD1 and FD2.

Figure 8:
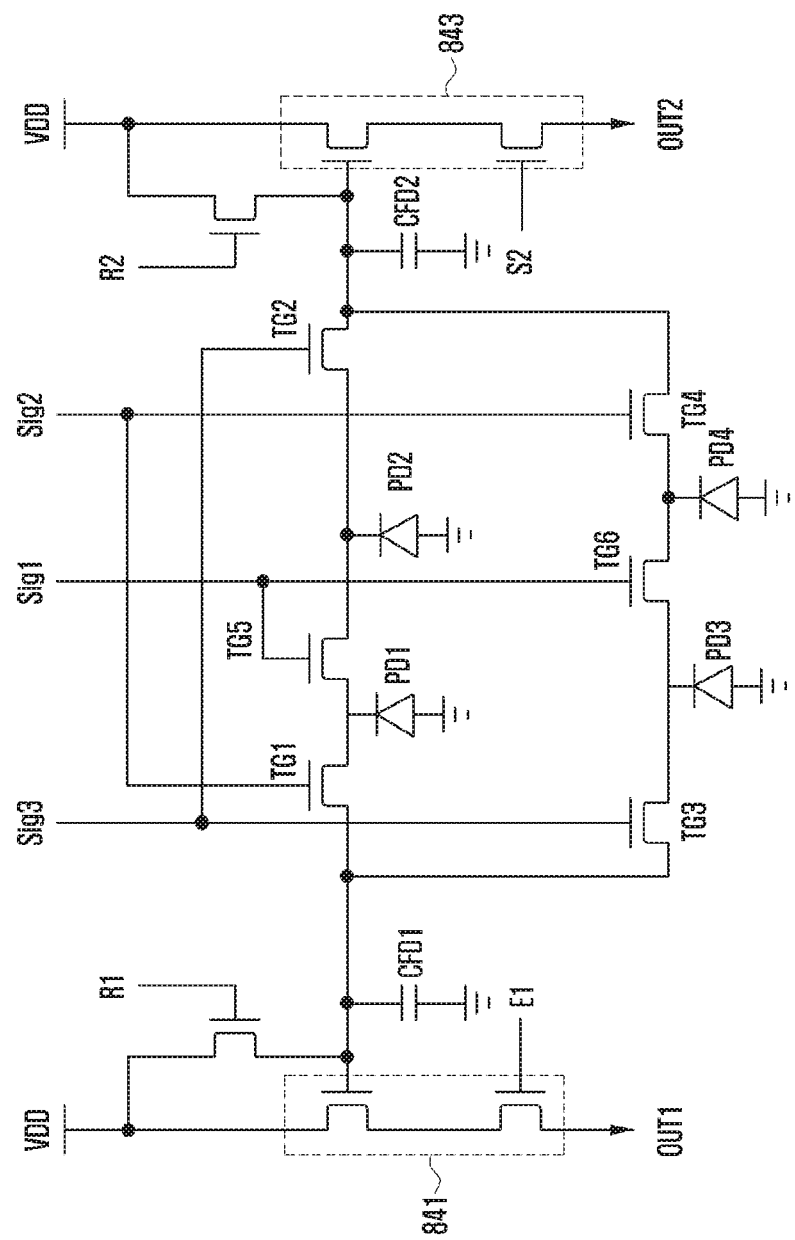
FIG. 8 illustrates a circuit diagram of a unit pixel of an image sensor according to various embodiments of the present disclosure.

FIG. 8 is a circuit diagram illustrating a unit pixel of an image sensor according to various embodiments of the present disclosure.

According to an embodiment, one end of each of photodiodes PD1, PD2, PD3 and PD4 may be connected with a corresponding one of transfer gates TG1, TG2, TG3 and TG4. For example, one end of the first photodiode PD1 may be connected with the first transfer gate TG1, and one end of the second photodiode PD2 may be connected with the second transfer gate TG2. Similarly, one end of the third photodiode PD3 may be connected with the third transfer gate TG3, and one end of the fourth photodiode PD4 may be connected with the fourth transfer gate TG4. In addition, the fifth transfer gate TG5 may be disposed between the first and second photodiodes PD1 and PD2, and the sixth transfer gate TG6 may be disposed between the third and fourth photodiodes PD3 and PD4.

According to an embodiment, the fifth and sixth transfer gates TG5 and TG6 may be electrically connected to be controlled simultaneously by the first control signal. Also, the first and fourth transfer gates TG1 and TG4 may be electrically connected to be controlled simultaneously by the second control signal. And also, the second and third transfer gates TG2 and TG3 may be electrically connected to be controlled simultaneously by the third control signal.

According to an embodiment, a node connected with the first and third transfer gates TG1 and TG3 may be connected with the first floating diffusion region CFD1. Also, a node connected with the second and fourth transfer gates TG2 and TG4 may be connected with the second floating diffusion region CFD2.

According to an embodiment, the first and second floating diffusion regions CFD1 and CFD2 may be connected with the first and second source followers 841 and 843, respectively. One end of each of the first and second source followers 841 and 843 may be connected with a power source VDD.

The first source follower 841 may output an electric energy corresponding to that stored in the first floating diffusion region CFD1 to the outside of the unit pixel. Also, the second source follower 843 may output an electric energy corresponding to that stored in the second floating diffusion region CFD2 to the outside of the unit pixel. In other words, the first and second source followers 841 and 843 may output first and second output signals, respectively.

According to an embodiment, the first and second source followers 841 and 843 may include first and second selection elements S1 and S2, respectively, for selecting an output signal. For example, the first source follower 841 may output the first output signal when a signal for a signal output is input to the first selection element S1. Also, the second source follower 843 may output the second output signal when a signal for a signal output is input to the second selection element S2.

According to an embodiment, the source and drain of first reset element R1 may be connected between an input end for controlling the first source follower 841 and the power source VDD. Also, the source and drain of second reset element R2 may be connected between an input end for controlling the second source follower 843 and the power source VDD. For example, by controlling the gate of first or second reset element R1 or R2, the image sensor may reset the circuit before and after the electric energy is stored in the first or second floating diffusion region CFD1 or CFD2, thus reducing error and offering a more exact auto focusing function.

According to an embodiment, by controlling the plurality of transfer gates TG1, TG2, TG3, TG4, TG5 and TG6, the image sensor may enable the unit pixel to output an added signal of at least two of electric signals converted by the first to fourth photodiodes PD1, PD2, PD3 and PD4. For example, the image sensor may add electric signals in the horizontal or vertical direction and then output the added signals through a combination of the first control signal for controlling the fifth and sixth transfer gates TG5 and TG6, the second control signal for controlling the first and fourth transfer gates TG1 and TG4, and the third control signal for controlling the second and third transfer gates TG2 and TG3.

For example, if the first and third control signals are turn-on signals and the second control signal is a turn-off signal, electric signals converted by the first and second photodiodes PD1 and PD2 may be added and electric signals converted by the third and fourth photodiodes PD3 and PD4 may be added. Also, since the second transfer gate TG2 electrically connects the second floating diffusion region CFD2 and the second photodiode PD2 in response to the third control signal, an added signal of electric signals converted by the first and second photodiodes PD1 and PD2 may be output to the outside of the unit pixel through the second floating diffusion region CFD2 and the second source follower 843. Additionally, since the third transfer gate TG3 electrically connects the first floating diffusion region CFD1 and the third photodiode PD3 in response to the third control signal, an added signal of electric signals converted by the third and fourth photodiodes PD3 and PD4 may be output to the outside of the unit pixel through the first floating diffusion region CFD1 and the first source follower 841.

In another embodiment, if the first control signal is a turn-off signal and the second and third control signals are turn-on signals, electric signals converted by the first and third photodiodes PD1 and PD3 may be added at the first floating diffusion region CFD1 and electric signals converted by the second and fourth photodiodes PD2 and PD4 may be added at the second floating diffusion region CFD2. For example, an added signal of electric signals converted by the left photodiodes PD1 and PD3 and an added signal of electric signals converted by the right photodiodes PD2 and PD4 may be output to the outside of the unit pixel through the first and second floating diffusion regions CFD1 and CFD2, respectively.

Figure 9:
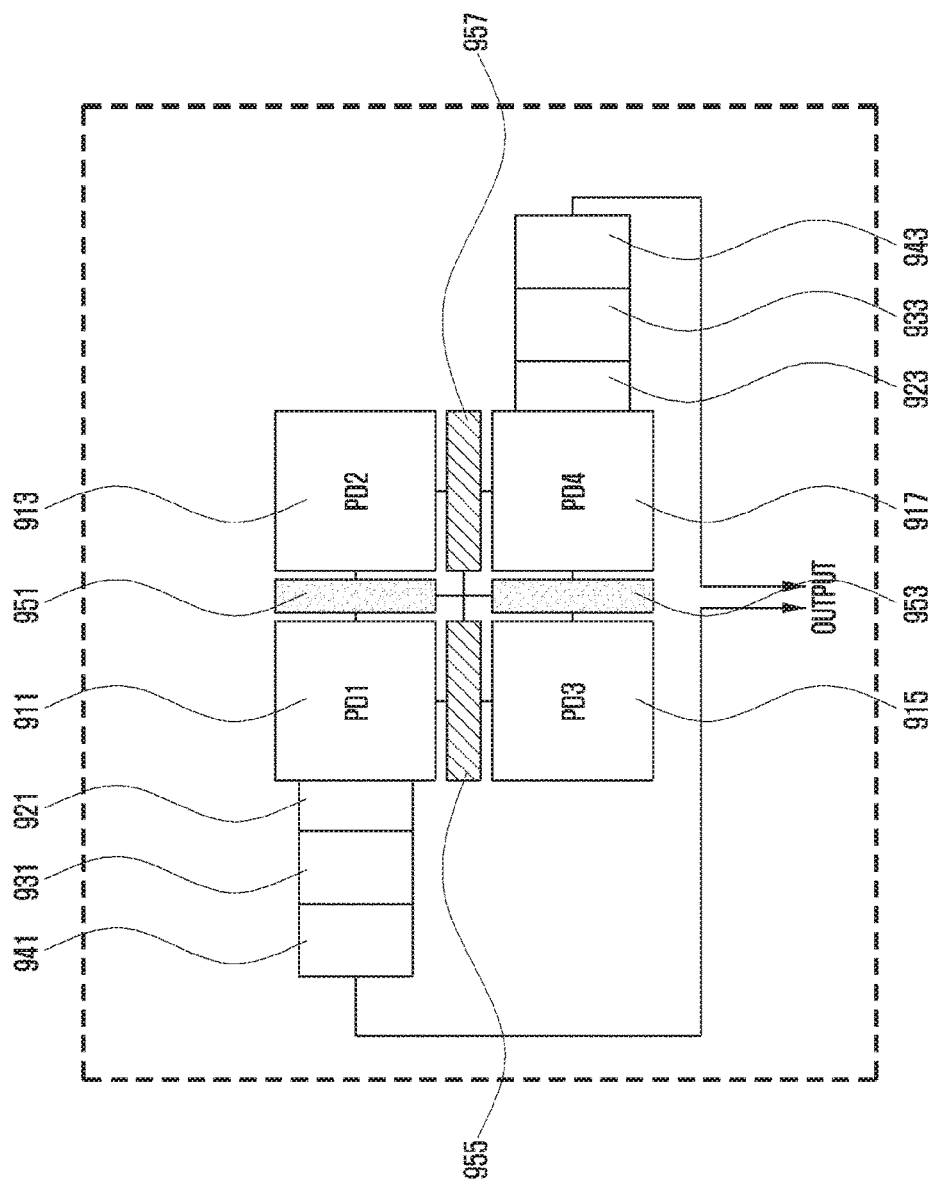
FIG. 9 illustrates a structure of a unit pixel of an image sensor according to various embodiments of the present disclosure.

FIG. 9 is a diagram illustrating a structure of a unit pixel of an image sensor according to various embodiments of the present disclosure.

According to an embodiment, the unit pixel of the image sensor may include a plurality of photodiodes 911, 913, 915 and 917, a plurality of transfer gates 921, 923, 951, 953, 955 and 957, a plurality of floating diffusion regions 931 and 933, and a plurality of source followers 941 and 943.

According to an embodiment, the unit pixel may include the first and second floating diffusion regions 931 and 933 for outputting electric signals converted by the first to fourth photodiodes 911, 913, 915 and 917 to the outside of the unit pixel under the control of the transfer gates.

According to an embodiment, each of the first and second floating diffusion regions 931 and 933 may be connected with one of the photodiodes 911, 913, 915 and 917. For example, the first floating diffusion region 931 may be electrically connected with the first photodiode 911. Also, the second floating diffusion region 933 may be electrically connected with the fourth photodiode 917.

According to an embodiment, the transfer gates 951, 953, 955 and 957 may be disposed between the photodiodes. For example, the first transfer gate 951 may be connected between the first and second photodiodes 911 and 913, and the second transfer gate 953 may be connected between the third and fourth photodiodes 915 and 917. Also, the third transfer gate 955 may be connected between the first and third photodiodes 911 and 915, and the fourth transfer gate 957 may be connected between the second and fourth photodiodes 913 and 917. The fifth transfer gate 921 may be connected between the first photodiode 911 and the first floating diffusion region 931. The sixth transfer gate 923 may be connected between the fourth photodiode 917 and the second floating diffusion region 933.

According to an embodiment, the first and second transfer gates 951 and 953 may be electrically connected to be controlled simultaneously by the first control signal. Similarly, the third and fourth transfer gates 955 and 957 may be electrically connected to be controlled simultaneously by the second control signal.

According to an embodiment, by controlling the transfer gates 921, 923, 951, 953, 955 and 957, the image sensor may enable the unit pixel to add and then output at least two of electric signals converted by the photodiodes 911, 913, 915 and 917.

Hereinafter, it is understood that the first and second control signals are signals for turning on or off the corresponding transfer gates.

For example, if the first control signal is a turn-on signal and the second control signal is a turn-off signal, the first transfer gate 951 may electrically connect the first and second photodiodes 911 and 913 such that the electric signals converted by the first and second photodiodes 911 and 913 may be added. Also, the second transfer gate 953 may electrically connect the third and fourth photodiodes 915 and 917 such that the electric signals converted by the third and fourth photodiodes 915 and 917 may be added. On the other hand, the third and fourth transfer gates 955 and 957 may electrically disconnect upper photodiodes and lower photodiodes.

In this case, an added signal of electric signals converted by the first and second photodiodes 911 and 913 may be output to the outside of the unit pixel through the first floating diffusion region 931 and the first source follower 941. Additionally, an added signal of electric signals converted by the third and fourth photodiodes 915 and 917 may be output to the outside of the unit pixel through the second floating diffusion region 933 and the second source follower 943.

In this case, the image sensor may obtain an upper added signal and a lower added signal. According to an embodiment, the processor may compare and process the electric signals converted by the upper photodiodes 911 and 913 and the electric signals converted by the lower photodiodes 915 and 917. For example, the processor may adjust the focus in the vertical direction (i.e., in the up and down direction) and perform an auto focusing function by detecting a phase difference between the upper and lower added electric signals and then processing the detected phase difference.

In another example, if the first control signal is a turn-off signal and the second control signal is a turn-on signal, the third transfer gate 955 may electrically connect the first and third photodiodes 911 and 915 such that the electric signals converted by the first and third photodiodes 911 and 915 may be added. Also, the fourth transfer gate 957 may electrically connect the second and fourth photodiodes 913 and 917 such that the electric signals converted by the second and fourth photodiodes 913 and 917 may be added. On the other hand, the first and second transfer gates 951 and 953 may electrically disconnect left photodiodes and right photodiodes. In this case, an added signal of electric signals converted by the first and third photodiodes 911 and 915 may be output to the outside of the unit pixel through the first floating diffusion region 931 and the first source follower 941. Additionally, an added signal of electric signals converted by the second and fourth photodiodes 913 and 917 may be output to the outside of the unit pixel through the second floating diffusion region 933 and the second source follower 943.

In this case, the image sensor may obtain a left added signal and a right added signal. According to an embodiment, the processor may compare and process the electric signals converted by the left photodiodes 911 and 915 and the electric signals converted by the right photodiodes 913 and 917. For example, the processor may adjust the focus in the horizontal direction (i.e., in the left and right direction) and perform an auto focusing function by detecting a phase difference between the left and right added electric signals and then processing the detected phase difference.

Figure 10:
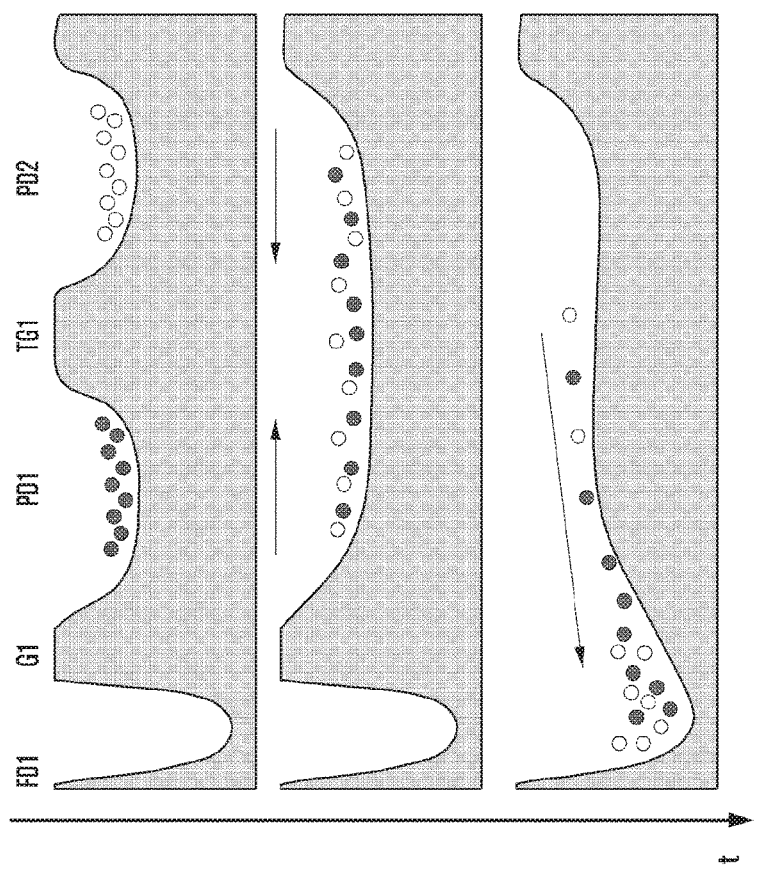
FIG. 10 illustrates an energy level in a unit pixel of an image sensor according to various embodiments of the present disclosure.

FIG. 10 is a diagram illustrating an energy level in a unit pixel of an image sensor according to various embodiments of the present disclosure. FIG. 10 shows a case in which electric energies (i.e., electric signals) converted by the first and second photodiodes are added in the unit pixel of the image sensor shown in FIG. 9.

According to an embodiment, the first transfer gate TG1 may be disposed between the first and second photodiodes PD1 and PD2 so as to turn on or off an electrical connection therebetween.

According to an embodiment, the first floating diffusion region FD1 may be disposed at one end of the first photodiode PD1 so as to add and output signals converted by the first or second photodiode PD1 or PD2.

According to an embodiment, the fifth transfer gate G1 may be disposed between the first photodiode PD1 and the first floating diffusion region FD1 so as to turn on or off an electrical connection therebetween.

According to an embodiment, the image sensor may control the first transfer gate TG1 (namely, lower the voltage applied across the first transfer gate TG1) to add an electric energy (e.g., an electric charge) converted from light by the first photodiode PD1 and an electric energy converted from light by the second photodiode PD2. Also, the image sensor may control the fifth transfer gate G1 (namely, lower the voltage applied across the fifth transfer gate G2) to move an added signal to the first floating diffusion region FD1. Namely, the image sensor may control the plurality of transfer gates TG1, G1 and G2 to add electric energies converted by the plurality of photodiodes PD1 and PD2 and then to store the added energies in the first floating diffusion region FD1. Also, the image sensor may add the electric energies converted by the first and second photodiodes PD1 and PD2 and then output the added energies to the outside of the unit pixel through the first floating diffusion region FD1.

Figure 11:
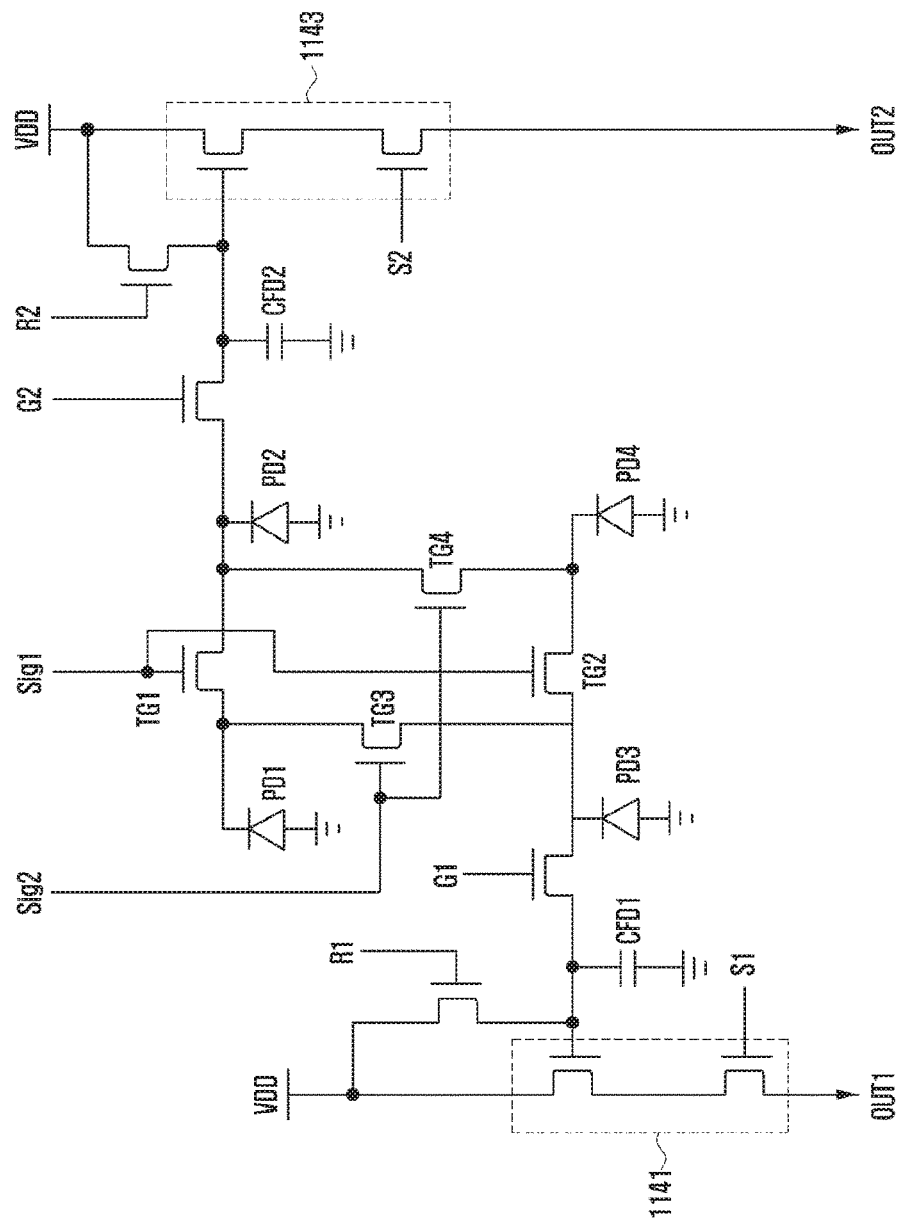
FIG. 11 illustrates a circuit diagram of a unit pixel of an image sensor according to various embodiments of the present disclosure.

FIG. 11 is a circuit diagram illustrating a unit pixel of an image sensor according to various embodiments of the present disclosure.

According to an embodiment, transfer gates TG1, TG2, TG3 and TG4 may be connected between photodiodes PD1, PD2, PD3 and PD4. For example, the first transfer gate TG1 may be connected between the first and second photodiodes PD1 and PD2, and the second transfer gate TG2 may be connected between the third and fourth photodiodes PD3 and PD4. The third transfer gate TG3 may be connected between the first and third photodiodes PD1 and PD3, and the fourth transfer gate TG4 may be connected between the second and fourth photodiodes PD2 and PD4. The fifth transfer gate G1 may be connected between the third photodiode PD3 and the first floating diffusion region CFD1. The sixth transfer gate G2 may be connected between the second photodiode PD2 and the second floating diffusion region CFD2.

According to an embodiment, the first and second transfer gates TG1 and TG5 may be electrically connected to be controlled simultaneously by the first control signal. Also, the third and fourth transfer gates TG3 and TG4 may be electrically connected to be controlled simultaneously by the second control signal.

According to an embodiment, each of the first and second floating diffusion regions CFD1 and CFD2 may be connected with at least one of the first to fourth photodiodes PD1 to PD4. For example, the first floating diffusion region CFD1 may be electrically connected with the third photodiode PD3. Also, the second floating diffusion region CFD2 may be electrically connected with the second photodiode PD2. According to an embodiment, the first and second transfer gates TG1 and TG2 may be electrically connected to be controlled simultaneously by the first control signal. Also, the third and fourth transfer gates TG3 and TG4 may be electrically connected to be controlled simultaneously by the second control signal.

According to an embodiment, the first and second floating diffusion regions CFD1 and CFD2 may be connected with the first and second source followers 1141 and 1143, respectively. One end of each of the first and second source followers 1141 and 1143 may be connected with a power source VDD.

The first source follower 1141 may output an electric energy corresponding to that stored in the first floating diffusion region CFD1 to the outside of the unit pixel. Also, the second source follower 1143 may output an electric energy corresponding to that stored in the second floating diffusion region CFD2 to the outside of the unit pixel. Namely, the first and second source followers 1141 and 1143 may output first and second output signals, respectively.

According to an embodiment, the first and second source followers 1141 and 1143 may include first and second selection elements S1 and S2, respectively, for selecting an output signal. For example, the first source follower 1141 may output the first output signal when a signal for a signal output is inputted to the first selection element S1. Also, the second source follower 1143 may output the second output signal when a signal for a signal output is inputted to the second selection element S2.

According to an embodiment, the source and drain of the first reset element R1 may be connected between an input end for controlling the first source follower 1141 and the power source VDD. Also, the source and drain of the second reset element R2 may be connected between an input end for controlling the second source follower 1143 and the power source VDD.

According to an embodiment, by controlling the plurality of transfer gates, the image sensor may enable the unit pixel to output an added signal of at least two of the electric signals converted by the plurality of photodiodes PD1, PD2, PD3 and PD4. For example, if the first control signal is a turn-on signal and the second control signal is a turn-off signal, electric signals converted by the first and second photodiodes PD1 and PD2 may be added. Also, electric signals converted by the third and fourth photodiodes PD3 and PD4 may be added. The third and fourth transfer gates TG3 and TG4 may electrically disconnect upper photodiodes PD1 and PD2 and lower photodiodes PD3 and PD4.

An added signal of electric signals converted by the first and second photodiodes PD1 and PD2 may be output to the outside of the unit pixel through the second floating diffusion region CFD2 and the second source follower 1143. Additionally, an added signal of electric signals converted by the third and fourth photodiodes PD3 and PD4 may be output to the outside of the unit pixel through the first floating diffusion region CFD1 and the first source follower 1141. In this case, the image sensor may obtain an upper added signal and a lower added signal.

In another example, if the first control signal is a turn-off signal and the second control signal is a turn-on signal, electric signals converted by the first and third photodiodes PD1 and PD3 may be added. Also, electric signals converted by the second and fourth photodiodes PD2 and PD4 may be added. The first and second transfer gates TG1 and TG2 may electrically disconnect left photodiodes PD1 and PD3 and right photodiodes PD2 and PD4. An added signal of electric signals converted by the first and third photodiodes PD1 and PD3 may be output to the outside of the unit pixel through the first floating diffusion region CFD1 and the first source follower 1141. Also, an added signal of electric signals converted by the second and fourth photodiodes PD2 and PD4 may be output to the outside of the unit pixel through the second floating diffusion region CFD2 and the second source follower 1143. In this case, the image sensor may obtain a left added signal and a right added signal.

Figure 12:
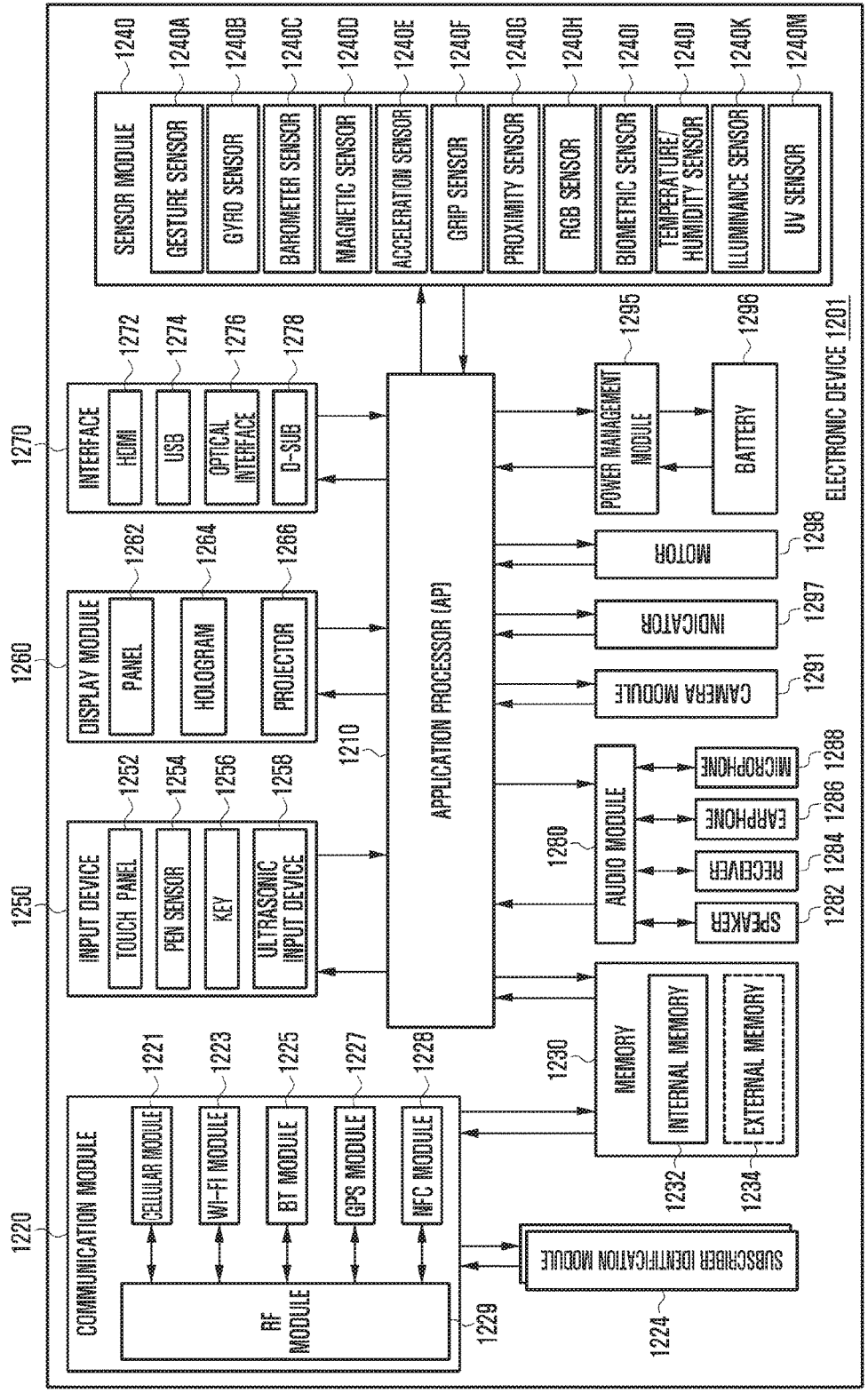
FIG. 12 illustrates a block diagram of an electronic device according to various embodiments of the present disclosure.

FIG. 12 is a block diagram illustrating an electronic device 1201 in accordance with an embodiment of the present disclosure. The electronic device 1201 may form, for example, the whole or part of an electronic device containing the light sensorshown in FIG. 1. Referring to FIG. 12, the electronic device 1201 may include at least one application processor (AP) 1210, a communication module 1220, a subscriber identification module (SIM) card 1224, a memory 1230, a sensor module 1240, an input device 1250, a display 1260, an interface 1270, an audio module 1280, a camera module 1291, a power management module 1295, a battery 1296, an indicator 1297, and a motor 1298.

The AP 1210 may drive an operating system or applications, control a plurality of hardware or software components connected thereto, and also perform processing and operation for various data including multimedia data. The AP 1210 may be formed as a system-on-chip (SoC), for example. According to an embodiment, the AP 1210 may further include a graphic processing unit (GPU) (not shown).

The communication module 1220 may perform a data communication with any other electronic device connected to the electronic device 1200 through the network. According to an embodiment, the communication module 1220 may include therein a cellular module 1221, a WiFi module 323, a BT module 1225, a GPS module 1227, an NFC module 1228, and an RF (Radio Frequency) module 1229.

The cellular module 1221 may offer a voice call, a video call, a message service, an internet service, or the like through a communication network (e.g., LTE, LTE-A, CDMA, WCDMA, UMTS, WiBro, or GSM, etc.). Additionally, the cellular module 1221 may perform identification and authentication of the electronic device in the communication network, using the SIM card 1224. According to an embodiment, the cellular module 1221 may perform at least part of functions the AP 1210 can provide. For example, the cellular module 1221 may perform at least part of a multimedia control function.

According to an embodiment, the cellular module 1221 may include a communication processor (CP). Additionally, the cellular module 1221 may be formed as an SoC, for example. Although some elements such as the cellular module 1221, the memory 1230, or the power management module 1295 are shown as separate elements being different from the AP 1210 in FIG. 3, the AP 1210 may be formed to have at least part (e.g., the cellular module 1221) of the above elements in an embodiment.

According to an embodiment, the AP 1210 or the cellular module 1221 may load commands or data, received from a nonvolatile memory connected thereto or from at least one of the other elements, into a volatile memory to process them. Additionally, the AP 1210 or the cellular module 1221 may store data, received from or created at one or more of the other elements, in the nonvolatile memory.

Each of the WiFi module 1223, the BT module 1225, the GPS module 1227 and the NFC module 1228 may include a processor for processing data transmitted or received therethrough. Although FIG. 12 shows the cellular module 1221, the WiFi module 1223, the BT module 1225, the GPS module 1227 and the NFC module 1228 as different blocks, at least some of them may be contained in a single IC (Integrated Circuit) chip or a single IC package in an embodiment. For example, at least some (e.g., a CP corresponding to the cellular module 1221 and a WiFi processor corresponding to the WiFi module 1223) of the respective processors corresponding to the cellular module 1221, the WiFi module 1223, the BT module 1225, the GPS module 1227 and the NFC module 1228 may be formed as a single SoC.

The RF module 1229 may transmit and receive data, e.g., RF signals or any other electric signals. Although not shown, the RF module 1229 may include a transceiver, a PAM (Power Amp Module), a frequency filter, an LNA (Low Noise Amplifier), or the like. Also, the RF module 1229 may include any component, e.g., a wire or a conductor, for transmission of electromagnetic waves in a free air space. Although FIG. 12 shows that the cellular module 1221, the WiFi module 1223, the BT module 1225, the GPS module 1227 and the NFC module 1228 share the RF module 1229, at least one of them may perform transmission and reception of RF signals through a separate RF module in an embodiment.

The SIM card 1224 may be a specific card formed of SIM and may be inserted into a slot formed at a certain place of the electronic device 1201. The SIM card 1224 may contain therein an ICCID (Integrated Circuit Card IDentifier) or an IMSI (International Mobile Subscriber Identity).

The memory 1230 may include an internal memory 1232 and an external memory 1234. The internal memory 1232 may include, for example, at least one of a volatile memory (e.g., DRAM (Dynamic RAM), SRAM (Static RAM), SDRAM (Synchronous DRAM), etc.) or a nonvolatile memory (e.g., OTPROM (One Time Programmable ROM), PROM (Programmable ROM), EPROM (Erasable and Programmable ROM), EEPROM (Electrically Erasable and Programmable ROM), mask ROM, flash ROM, NAND flash memory, NOR flash memory, etc.). According to an embodiment, the internal memory 1232 may have the form of an SSD (Solid State Drive). The external memory 1234 may include a flash drive, e.g., CF (Compact Flash), SD (Secure Digital), Micro-SD (Micro Secure Digital), Mini-SD (Mini Secure Digital), xD (eXtreme Digital), memory stick, or the like. The external memory 1234 may be functionally connected to the electronic device 1201 through various interfaces. According to an embodiment, the electronic device 1201 may further include a storage device or medium such as a hard drive.

The sensor module 1240 may measure physical quantity or sense an operating status of the electronic device 1201, and then convert measured or sensed information into electric signals. The sensor module 1240 may include, for example, at least one of a gesture sensor 1240A, a gyro sensor 1240B, an atmospheric sensor 1240C, a magnetic sensor 1240D, an acceleration sensor 1240E, a grip sensor 1240F, a proximity sensor 1240G, a color sensor 1240H (e.g., RGB (Red, Green, Blue) sensor), a biometric sensor 1240I, a temperature-humidity sensor 1240I, an illumination sensor 1240K, and a UV (ultraviolet) sensor 1240M. Additionally or alternatively, the sensor module 1240 may include, e.g., an E-nose sensor (not shown), an EMG (electromyography) sensor (not shown), an EEG (electroencephalogram) sensor (not shown), an ECG (electrocardiogram) sensor (not shown), an IR (infrared) sensor (not shown), an iris scan sensor (not shown), or a fingerprint scan sensor (not shown). Also, the sensor module 1240 may include a control circuit for controlling one or more sensors equipped therein.

The input device 1250 may include a touch panel 1252, a digital pen sensor 1254, a key 1256, or an ultrasonic input unit 1258. The touch panel 1252 may recognize a touch input in a manner of capacitive type, resistive type, infrared type, or ultrasonic type. Also, the touch panel 1252 may further include a control circuit. In case of a capacitive type, a physical contact or proximity may be recognized. The touch panel 1252 may further include a tactile layer. In this case, the touch panel 1252 may offer a tactile feedback to a user.

The digital pen sensor 1254 may be formed in the same or similar manner as receiving a touch input or by using a separate recognition sheet. The key 1256 may include, for example, a physical button, an optical key, or a keypad. The ultrasonic input unit 1258 is a specific device capable of identifying data by sensing sound waves with a microphone 1288 in the electronic device 1201 through an input tool that generates ultrasonic signals, thus allowing wireless recognition. According to an embodiment, the electronic device 1201 may receive a user input from any external device (e.g., a computer or a server) connected thereto through the communication module 1220.

The display module 1260 may include a panel 1262, a hologram 1264, or a projector 1266. The panel 1262 may be, for example, LCD (Liquid Crystal Display), AM-OLED (Active Matrix Organic Light Emitting Diode), or the like. The panel 1262 may have a flexible, transparent or wearable form. The panel 1262 may be formed of a single module with the touch panel 1252. The hologram 1264 may show a stereoscopic image in the air using interference of light. The projector 1266 may project an image onto a screen, which may be located at the inside or outside of the electronic device 1201. According to an embodiment, the display 1260 may further include a control circuit for controlling the panel 1262, the hologram 1264, and the projector 1266.

The interface 1270 may include, for example, an HDMI (High-Definition Multimedia Interface) 1272, a USB (Universal Serial Bus) 1274, an optical interface 1276, or a D-sub (D-subminiature) 1278. Additionally or alternatively, the interface 1270 may include, for example, an MHL (Mobile High-definition Link) interface, an SD (Secure Digital) card/MMC (Multi-Media Card) interface, or an IrDA (Infrared Data Association) interface.

The audio module 1280 may perform a conversion between sounds and electric signals. The audio module 1280 may process sound information input or output through a speaker 1282, a receiver 1284, an earphone 1286, or a microphone 1288.

The camera module 1291 is a device capable of obtaining still images and moving images. According to an embodiment, the camera module 1291 may include at least one image sensor (e.g., a front sensor or a rear sensor), a lens, an image signal processor (ISP), or a flash (e.g., LED, xenon lamp, etc.).

According to an embodiment, the camera module 1291 may include an image sensor. According to an embodiment, the image sensor may include a plurality of pixels. For example, the image sensor may include a pixel array composed of a plurality of unit pixels. For example, the image sensor may be a CMOS image sensor. According to an embodiment, each of the plurality of pixels may include first, second, third and fourth photodiodes for converting light into an electric signal, and an electric circuit for adding at least two of the electrical signals converted respectively by the first, second, third and fourth photodiodes and then outputting the added signals. According to an embodiment, the electric circuit may include a plurality of floating diffusion regions for adding and outputting the at least two of the electrical signals converted respectively by the first, second, third and fourth photodiodes, and a plurality of transfer gates for turning on or off electrical connections between the photodiodes and the floating diffusion regions.

According to an embodiment, the image signal processor may perform an auto focusing (AF) function, based on at least an added signal output from the image sensor.

The power management module 1295 may manage electric power of the electronic device 1201. Although not shown, the power management module 1295 may include, for example, a PMIC (Power Management Integrated Circuit), a charger IC, or a battery or fuel gauge.

The PMIC may be formed, for example, as an IC chip or SoC. Charging may be performed in a wired or wireless manner. The charger IC may charge a battery 1296 and prevent overvoltage or overcurrent from a charger. According to an embodiment, the charger IC may have a charger IC used for at least one of wired and wireless charging types. A wireless charging type may include, for example, a magnetic resonance type, a magnetic induction type, or an electromagnetic type. Any additional circuit for a wireless charging may be further used such as a coil loop, a resonance circuit, or a rectifier.

The battery gauge may measure the residual amount of the battery 1296 and a voltage, current or temperature in a charging process. The battery 1296 may store or create electric power therein and supply electric power to the electronic device 1201. The battery 1296 may be, for example, a rechargeable battery or a solar battery.

The indicator 1297 may show thereon a current status (e.g., a booting status, a message status, or a recharging status) of the electronic device 1201 or of its parts (e.g., the AP 1210). The motor 1298 may convert an electric signal into a mechanical vibration. Although not shown, the electronic device 1201 may include a specific processor (e.g., GPU) for supporting a mobile TV. This processor may process media data that comply with standards of DMB (Digital Multimedia Broadcasting), DVB (Digital Video Broadcasting), or media flow.

Each of the above-discussed elements of the electronic device disclosed herein may be formed of one or more components, and its name may be varied according to the type of the electronic device. The electronic device disclosed herein may be formed of at least one of the above-discussed elements without some elements or with additional other elements. Some of the elements may be integrated into a single entity that still performs the same functions as those of such elements before integrated.

The term "module" used in this disclosure may refer to a certain unit that includes one of hardware, software and firmware or any combination thereof. The module may be interchangeably used with unit, logic, logical block, component, or circuit, for example. The module may be the minimum unit, or part thereof, which performs one or more particular functions. The module may be formed mechanically or electronically. For example, the module disclosed herein may include at least one of an ASIC (Application-Specific Integrated Circuit) chip, FPGAs (Field-Programmable Gate Arrays), and a programmable-logic device, which have been known or are to be developed.

Although the present disclosure has been described with an exemplary embodiment, various changes and modifications may be suggested to one skilled in the art. It is intended that the present disclosure encompass such changes and modifications as fall within the scope of the appended claims.

What is claimed is:
1. An electronic device comprising:
 an image sensor including a plurality of pixels; and
 a processor configured to control operations of the image sensor and perform an auto focusing function,
 wherein each of the plurality of pixels comprises:
  first, second, thirds and fourth photodiodes configured to convert light into an electrical signal, respectively; and
  an electric circuit configured to:
   add the electrical signals converted respectively by the first, second, third, and fourth photodiodes to generate added signals, and
   output the added signals,
  wherein the electric circuit includes:
   a plurality of floating diffusion regions configured to:
    using at least one floating diffusion capacitor, add a first two electrical signals in a first direction among the electrical signals converted respectively by the first, second, third, and fourth photodiodes to generate a first added signal,
    using at least another floating diffusion capacitor, add a second two electrical signals in the first direction among the electrical signals con- verted respectively by the first, second, third, and fourth photodiodes to generate a second added signal, using the at least one floating diffusion capacitor, add a third two electrical signals in a second direction different from the first direction among the electrical signals converted respectively by the first, second, third, and fourth photodiodes to generate a third added signal, using the at least another floating diffusion capacitor, add a fourth two electrical signals in the second direction among the electrical signals converted respectively by the first, second, third, and fourth photodiodes to generate a fourth added signal, and output the first, second, third, and fourth added signals; and a plurality of transfer gates configured to selectively electrically connect the photodiodes and the plurality of floating diffusion regions, wherein the processor outputs at least one control signal for controlling the plurality of transfer gates, and wherein the processor is further configured to:

compare the first added signal and the second added signal to detect a phase difference in the first direction, compare the third added signal and the fourth added signal to detect a phase difference in the second direction, and perform the auto focusing function based on the phase differences in the first and second directions.

2. The electronic device of claim 1, wherein the first, second, third, and fourth photodiodes are disposed respectively at upper left, upper right, lower left, and lower right positions of the image sensor and are arranged in a grid form.

3. The electronic device of claim 1, wherein the plurality of floating diffusion regions includes:

a first floating diffusion region configured to:
add the electrical signals received from the first or third photodiode to generate the first added signal; and
output the first added signal; and a second floating diffusion region configured to:
add the electrical signals received from the second or fourth photodiode to generate the second added signal; and
output the second added signal, wherein the plurality of transfer gates includes:
a first transfer gate configured to selectively electrically connect the first photodiode and the first floating diffusion region;
a second transfer gate configured to selectively electrically connect the second photodiode and the second floating diffusion region;
a third transfer gate configured to selectively electrically connect the third photodiode and the first floating diffusion region;
a fourth transfer gate configured to selectively electrically connect the fourth photodiode and the second floating diffusion region;
a fifth transfer gate configured to selectively electrically connect the first and second photodiodes; and
a sixth transfer gate configured to selectively electrically connect the third and fourth photodiodes.

4. The electronic device of claim 3, wherein the first and fourth transfer gates are electrically connected so as to be controlled by a same first control signal, wherein the second and third transfer gates are electrically connected so as to be controlled by a same second control signal, and wherein the fifth and sixth transfer gates are electrically connected so as to be controlled by a same third control signal.

5. The electronic device of claim 1, wherein the plurality of floating diffusion regions includes:

a first floating diffusion region configured to:
add the electrical signals received from the first photodiode to generate the first added signal; and
output the first added signal; and a second floating diffusion region configured to:
add the electrical signals received from the fourth photodiode to generate the second added signal; and
output the second added signal, and wherein the plurality of transfer gates includes:
a first transfer gate configured to selectively electrically connect the first and second photodiodes;
a second transfer gate configured to selectively electrically connect the third and fourth photodiodes;
a third transfer gate configured to selectively electrically connect the first and third photodiodes; and
a fourth transfer gate configured to selectively electrically connect the second and fourth photodiodes.

6. The electronic device of claim 5, wherein the first and second transfer gates are electrically connected so as to be controlled by a same first control signal, and wherein the third and fourth transfer gates are electrically connected so as to be controlled by a same second control signal.

7. A method of sensing images, comprising:

converting light into first, second, third, and fourth electrical signals by first, second, third, and fourth photodiodes;

selectively electrically connecting the photodiodes and a plurality of floating diffusion regions, the plurality of floating diffusion regions including a plurality of floating diffusion capacitors, adding, by the plurality of floating diffusion regions, using at least one of the plurality of floating diffusion capacitors, a first two electrical signals in a first direction among the first, second, third, and fourth electrical signals to generate a first added signal;

adding, by the plurality of floating diffusion regions, using at least another of the plurality of floating diffusion capacitors, a second two electrical signals in the first direction among the first, second, third, and fourth electrical signals to generate a second added signal;

adding, by the plurality of floating diffusion regions, using the at least one of the plurality of floating diffusion capacitors, a third two electrical signals in a second direction different from the first direction among the first, second, third, and fourth electrical signals to generate a third added signal;

adding, by the plurality of floating diffusion regions, using the at least another of the plurality of floating diffusion capacitors, a fourth two electrical signals in the second direction among the first, second, third, and fourth electrical signals to generate a fourth added signal;

outputting, by the plurality of floating diffusion regions, the first, second, third, and fourth added signals;

comparing, by a processor, the first added signal and the second added signal to detect a phase difference in the first direction;

comparing, by the processor, the third added signal and the fourth added signal to detect a phase difference in the second direction; and performing, by the processor, an auto focusing function based on the phase differences in the first and second directions.

8. The method of claim 7, wherein the selectively electrically connecting is performed with a plurality of transfer gates.

9. The method of claim 8, further comprising:
controlling first and second transfer gates of the plurality of transfer gates with a same first control signal; and
controlling third and fourth transfer gates of the plurality of transfer gates with a same second control signal.

10. The method of claim 8, further comprising:
controlling first and fourth transfer gates of the plurality of transfer gates with a same first control signal;
controlling second and third transfer gates of the plurality of transfer gates with a same second control signal; and
controlling fifth and sixth transfer gates of the plurality of transfer gates with a same third control signal.

* * * * *